US009160582B1

United States Patent
Huss et al.

(10) Patent No.: US 9,160,582 B1
(45) Date of Patent: Oct. 13, 2015

(54) SYSTEM AND METHOD FOR PHASE RECOVERY WITH SELECTIVE MITIGATION OF TIMING CORRUPTION DUE TO DIGITAL RECEIVER EQUALIZATION

(71) Applicant: CADENCE DESIGN SYSTEMS, INC., San Jose, CA (US)

(72) Inventors: Scott Huss, Cary, NC (US); Chris Moscone, Cary, NC (US); James Vandersand, Jr., Durham, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 38 days.

(21) Appl. No.: 14/230,121

(22) Filed: Mar. 31, 2014

(51) Int. Cl.
 *H04B 1/10* (2006.01)
 *H04L 25/03* (2006.01)
(52) U.S. Cl.
 CPC ............................ *H04L 25/03885* (2013.01)
(58) Field of Classification Search
 CPC ....... H03L 7/0891; H03L 7/091; H03L 7/033; H03L 25/03885
 See application file for complete search history.

(56) References Cited

U.S. PATENT DOCUMENTS

| 7,065,160 | B2* | 6/2006 | Berger et al. | 375/340 |
| 7,639,737 | B2* | 12/2009 | Palmer | 375/232 |
| 2005/0265487 | A1* | 12/2005 | Sou | 375/326 |
| 2006/0109940 | A1* | 5/2006 | Beukema et al. | 375/350 |
| 2006/0233291 | A1* | 10/2006 | Garlepp et al. | 375/355 |
| 2010/0061440 | A1* | 3/2010 | Lee | 375/233 |
| 2011/0050474 | A1* | 3/2011 | Kang | 341/143 |

* cited by examiner

*Primary Examiner* — Daniel Washburn
*Assistant Examiner* — Amneet Singh
(74) *Attorney, Agent, or Firm* — Rosenberg, Klein & Lee

(57) ABSTRACT

A system and method are provided for phase recovery of a signal received by a receiver having digital equalization. A sample acquisition unit periodically acquires a plurality of I and Q samples of the received signal. The sample acquisition unit includes a delay portion to enable selective mutual comparisons between a current I sample ID0, a first preceding I samples ID1, and a second preceding I sample ID2. A transition detection unit generates at least one transition detect signal responsive to the ID1, ID0, and Q samples. The transition detect signal indicates a logic state transition in the received signal between the ID1 and ID0 samples. A transition filtering unit generates an equalization detect signal indicative of excessive equalizing correction of the received signal at the ID0 sample, and selectively passes in response the transition detect signal as a timing output signal.

20 Claims, 25 Drawing Sheets

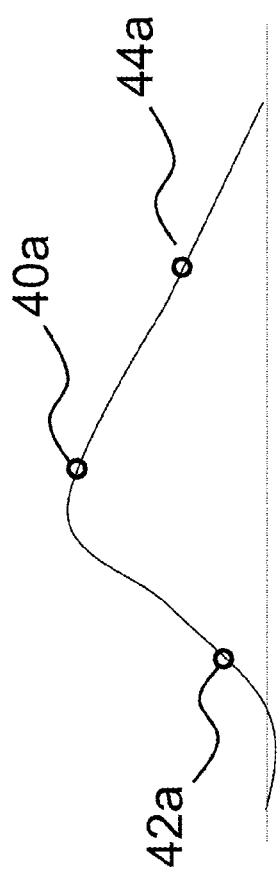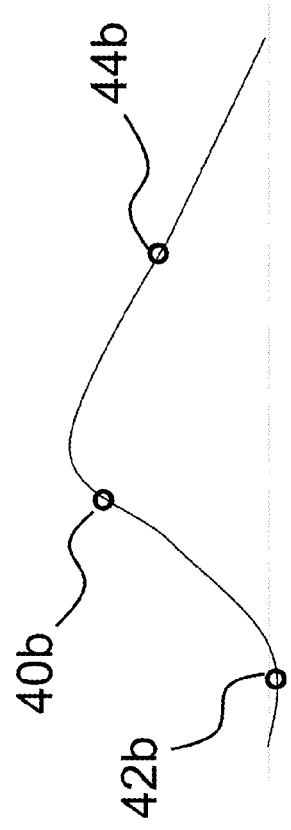

| ID2 | ID1 | Q | ID0 | Conventional PD | Corruption Mitigated PD |
|---|---|---|---|---|---|
| 0 | 0 | 0 | 0 | 0 | 0 |
| 0 | 0 | 0 | 1 | -1 | -1 |
| 0 | 0 | 1 | 0 | 0 | 0 |
| 0 | 0 | 1 | 1 | +1 | +1 |
| 0 | 1 | 0 | 0 | +1 | 0 |
| 0 | 1 | 0 | 1 | 0 | 0 |
| 0 | 1 | 1 | 0 | -1 | 0 |
| 0 | 1 | 1 | 1 | 0 | 0 |
| 1 | 0 | 0 | 0 | 0 | 0 |
| 1 | 0 | 0 | 1 | -1 | 0 |
| 1 | 0 | 1 | 0 | 0 | 0 |
| 1 | 0 | 1 | 1 | +1 | +1 |
| 1 | 1 | 0 | 0 | +1 | 0 |
| 1 | 1 | 0 | 1 | 0 | 0 |
| 1 | 1 | 1 | 0 | -1 | -1 |
| 1 | 1 | 1 | 1 | 0 | 0 |

FIG. 6

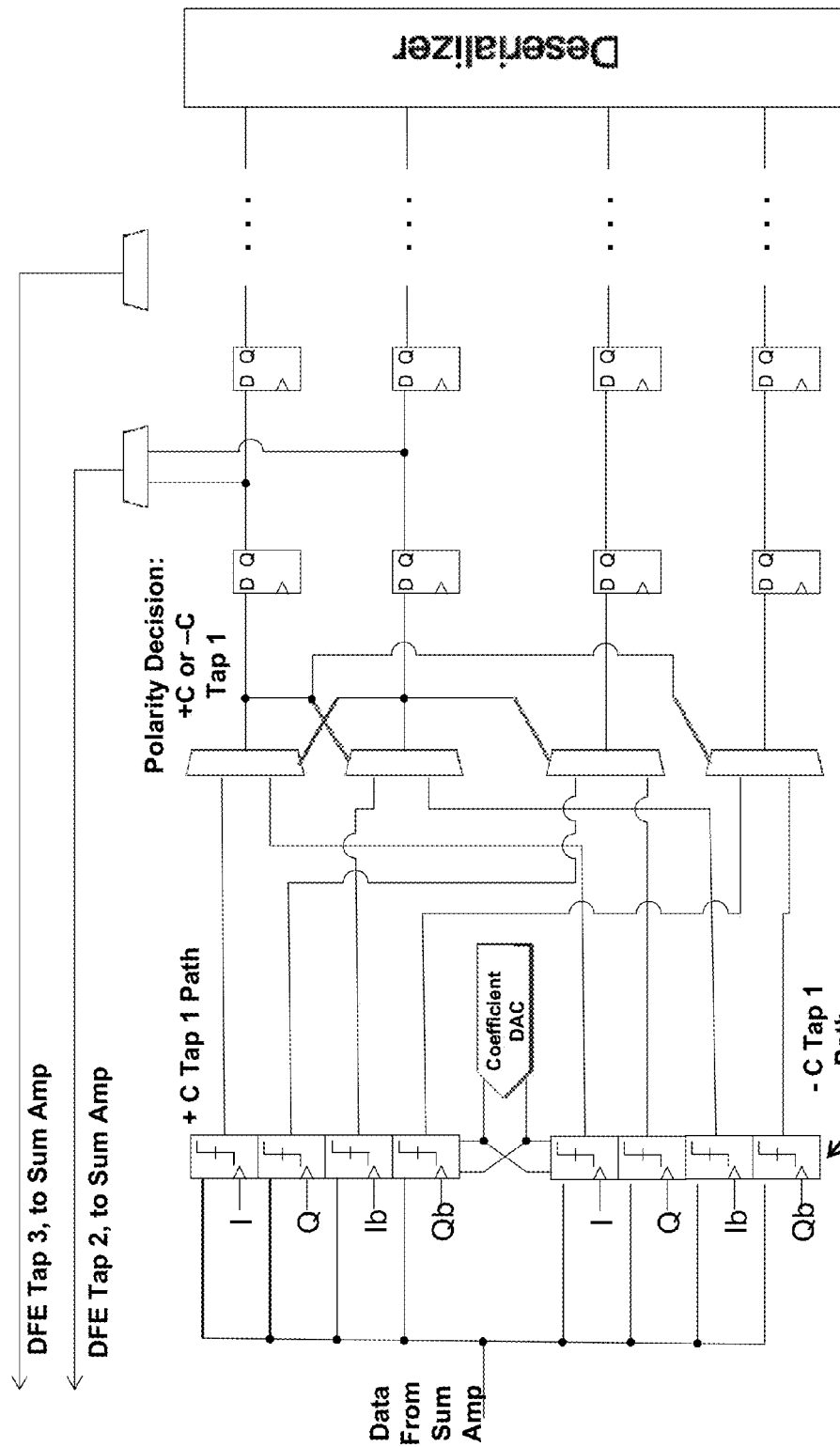

Old Phase Detector with ¼ UI DFE Delay

- DFE Taps

Old Phase Detector with 3/4 UI DFE Delay

- DFE Taps

Old Phase Detector with 3/4 UI DFE Delay
• CTLE Eye

New Phase Detector with ¼ UI DFE Delay
- Equalized Eye

Measured Results

SYSTEM AND METHOD FOR PHASE RECOVERY WITH SELECTIVE MITIGATION OF TIMING CORRUPTION DUE TO DIGITAL RECEIVER EQUALIZATION

BACKGROUND OF THE INVENTION

The subject system and method are generally directed to an optimized timing recovery system for a receiver which employs digital receiver equalization to guard against the effects of intersymbol interference (ISI). More specifically, the subject system and method are directed to carrying out accurate phase recovery for such systems, and doing so in a manner which adaptively mitigates the potential corrupting effects of the digital receiver equalization thereon.

In various digital systems, signals are generally transmitted from a transmitter to a receiver through a transmission channel established therebetween. The channel may be any suitable medium which links the transmitter to the receiver, and may be established in wired or wireless manner. Depending on the particular application, the channel may be quite lossy, especially at high data transmission speeds (for example, on the order of 8 Gigabits/second or even higher). The transmission losses due to interference, attenuation, delay, and the like in the channel may have considerable detrimental effect on the transmitted signal by the time it reaches the receiver. In digital systems, such channel transmission effects cause sufficient amplitude and phase distortion to cause intersymbol interference (ISI) in the signal received at the receiver. That is, a pulse or other symbol representing the logic state of one data bit may be effectively 'smeared' to the degree that it contributes to the content of one or more succeeding bits. ISI generally includes the distortion of succeeding bits (called post-cursor ISI) and preceding bits (called pre-cursor ISI).

To guard against such detrimental effects, in particular post-cursor ISI, receiver systems heretofore known employ such digital receiver equalization measures as decision feedback equalization (DFE) to correct the received data by adaptive scaling. In digital receiver systems, however, some form of timing recovery, such as in clock and data recovery (CDR) blocks, is typically performed. An unintended consequence of digital equalization is that the corrective scaling may in certain instances corrupt phase detection during timing recovery. The greater the required equalization correction, the greater the likelihood of corrupting phase detection.

Approaches have been taken in the art to minimize the detrimental effect of DFE on timing recovery. These include the following:
- Designing the receiver with sufficiently complex front end hardware that the required equalization corrections are minimized in degree;
- Employing baud rate timing recovery that inefficiently avoids the use of timing information at the edges of received symbols; and,
- Using a separate, dedicated clock path for frequency recovery followed by a phase interpolator to adjust phase, such that phase interpolators are employed in both clock recovery (frequency lock) and the phase lock paths. But each approach has notable drawbacks which limits its use in many applications, prohibitively so in some applications.

There is therefore a need for a timing recovery system for a receiver employing digital equalization which mitigates potential timing corruption due to that digital equalization of the received signal. There is a need for such timing recovery system wherein the potential corruption is selectively mitigated on an as needed basis for system simplicity and economy.

SUMMARY OF THE INVENTION

It is an object of the present invention to provide a system and method for selectively mitigating timing corruption in timing recovery due to digital receiver equalization.

It is another object of the present invention to provide a system and method for simply and efficiently carries out phase recovery with selective mitigation of timing corruption due to digital receiver equalization.

These and other objects are attained in a system for phase recovery of a signal received by a receiver having digital equalization comprises a sample acquisition unit periodically acquiring over a series of predetermined unit intervals (UI) a plurality of in-phase (I) and quadrature (Q) samples of the received signal, where each Q sample is disposed between consecutive I samples. The sample acquisition unit includes a delay portion for selective mutual comparisons between a current I sample ID0, a first preceding I sample ID1, and a second preceding I sample ID2, wherein the ID0, ID1, ID2 samples are offset from one another by at least one UI. A transition detection unit is coupled to the sample acquisition unit, which transition detection unit generates at least one transition detect signal responsive to the ID1 and ID0 samples and the Q sample disposed therebetween. The transition detect signal is indicative of a logic state transition in the received signal between the ID1 and ID0 samples. A transition filtering unit is coupled to the sample acquisition and transition detection units, and operates to generate an equalization detect signal indicative of excessive equalizing correction of the received signal at the ID0 sample. The transition filtering unit actuates responsive to the equalization detect signal to selectively pass the transition detect signal to an output node, whereby potential corruption in the transition detect signal due to excessive equalization correction of the received signal at the ID0 sample is selectively mitigated.

A method realized in accordance with the present invention provides for phase recovery of a signal received by a receiver having digital equalization. The method comprises periodically acquiring over a series of predetermined UI's a plurality of I and Q samples of the received signal, each Q sample being disposed between consecutive I samples. The method further comprises selectively delaying the acquired I samples for mutual comparisons between a current I sample ID0, a first preceding I sample ID1, and a second preceding I sample ID2, wherein the ID0, ID1, ID2 samples are offset from one another by at least one UI. A transition detection unit is established which executes to generate at least one transition detect signal responsive to the ID1 and ID0 samples and the Q sample disposed therebetween, the transition detect signal being indicative of a logic state transition in the received signal between the ID1 and ID0 samples. A transition filtering unit coupled to the transition detection unit is established, which executes to generate an equalization detect signal indicative of excessive equalizing correction of the received signal at the ID0 sample. The transition filtering unit is executed responsive to the equalization detect signal to selectively pass the transition detect signal to an output node. Potential corruption in the transition detect signal due to excessive equalization correction of the received signal at the ID0 sample is thereby selectively mitigated.

A system formed in accordance with certain embodiments of the present invention provides for phase detection during timing recovery for signals received by a receiver having decision feedback equalization. The system comprises a sample acquisition unit periodically acquiring over a series of predetermined UI's a plurality of I and Q samples of the received signal, each Q sample being disposed between consecutive I samples. The sample acquisition unit includes a delay portion for selective mutual comparisons of a current I sample ID0, a first preceding I sample ID1, and a second preceding I sample ID2 one I sample with respect to at least one other, wherein the ID0, ID1, ID2 samples are offset from one another by at least one UI. A transition detection unit is coupled to the sample acquisition unit, which generates at least first and second transition detect signals responsive to the ID1 and ID0 samples and the Q sample disposed therebetween. The first and second transition detect signals are respectively indicative of early and late arrivals of the logic state transition in the received signal at the Q sample between the ID1 and ID0 samples. A transition filtering unit is coupled to the sample acquisition and transition detection units, which transition filtering unit acquires a pattern of logic state transitions between respective pairs of the ID2, ID1, and ID0 samples to generate responsive thereto an equalization detect signal indicative of excessive equalizing correction of the received signal at the ID0 sample. Such transition filtering unit actuates responsive to the equalization detect signal to selectively set a timing output signal to one of the first and second transition detect signals. Accordingly, potential corruption in the transition detect signal due to excessive equalization correction of the received signal at the ID0 sample is selectively mitigated.

BRIEF DESCRIPTION OF THE DRAWINGS

FIGS. 4A-4B are comparative waveforms illustrating the effects of late and early sampling phase on the amount of pre-cursor ISI introduced into signal samples;

FIG. 6 is a sample truth table illustrating the pattern filtering operation carried out by the exemplary embodiment of FIG. 5;

FIG. 7 is a block diagram schematically illustrating a portion of a receiver employing one example of a loop unrolled DFE;

DESCRIPTION OF THE PREFERRED EMBODIMENTS

Figure 1:
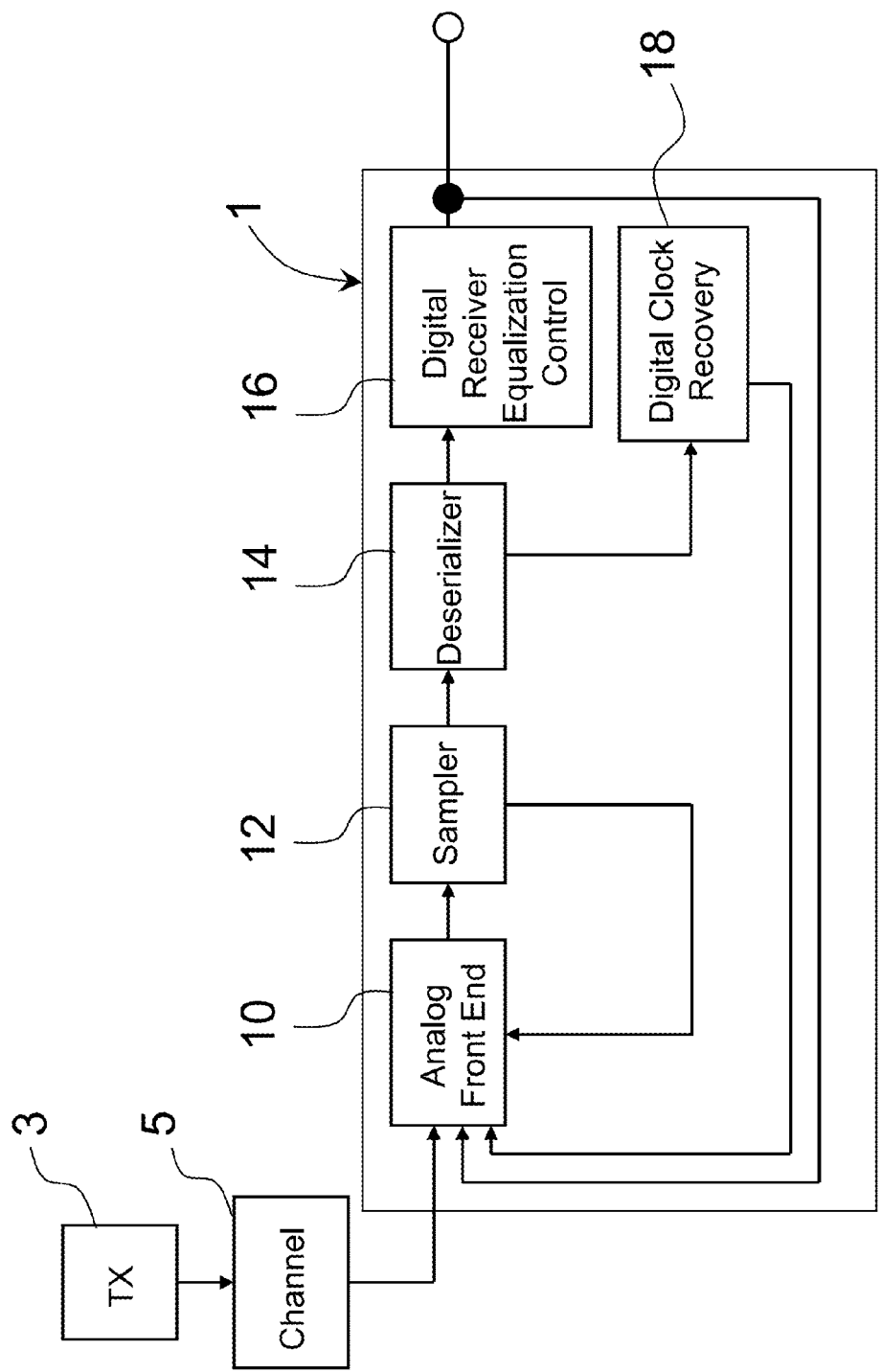
FIG. 1 is a block diagram schematically illustrating an example of a receiver in which a system formed in accordance with an exemplary embodiment of the present invention may be incorporated.

The subject system and method generally serve to preserve the accuracy of timing recovery in a digital receiver system that receives signals transmitted from a driver or other transmitting source through a given channel. The receiver may be of any type or configuration known in the art, which employs digital equalization measures to counteract detrimental effects like ISI encountered during transmission through a non-ideal channel. One of numerous examples of receiver systems in which the subject system and method may be implemented is shown in FIG. 1.

As shown, the receiver 1 in this illustrative example is linked to a transmitter 3 via a communications channel 5 of any suitable type and medium known in the art. The receiver 1 includes an analog front end 10 which receives the transmitted signals passed by the channel 5. A sampler 12 samples and quantizes the incoming received signal according to the particular requirements of the given application to generate in-phase (I) and quadrature (Q) samples over a series of predetermined unit intervals (UI), with each Q sample being disposed between consecutive I samples preferably offset from each by ½ UI. The sampler 12 feeds the sampled and quantized data back to the analog front end 10 for DFE correction, as described in following paragraphs (as will become apparent in following paragraphs for the example shown, only the taps that are not loop unrolled are subject to this feed back to the analog front end). The Digital equalization control scales this data and then it is added back to the received signal. This would be an example of a non-loop unrolled implementation. A deserializer 14 receives the quantized samples and formulates the required multi-bit I and Q data as needed. A digital receiver equalization control 16 carries out predetermined control processing for the equalization utilized by the receiver based on data received from the deserializer 14, and feeds back various equalization information to the analog front end 10 for corrective incorporation. A digital clock recovery block 18 carries out clock and data timing recovery from I and Q data received from the deserializer 14, and feeds the detected phase information to the analog front end 10 to effect timing convergence.

Various digital equalization schemes are known in the art. In the receiver example illustrated, a multi-tap DFE is employed. As a feedback equalizer, a DFE generally makes a logic 1-or-0 decision on sampled data. The decision is scaled and delayed and then fed back to the receiver front end, where it is added back into the received data. So the DFE establishes a feedback loop where the decision made in that loop. A notable advantage of a DFE is that since a decision is made on the data—either a logic one or a logic zero—the DFE effectively provides for substantially noiseless operation. ISI in the channel may be corrected for without introducing noise in the process.

A DFE may have multiple feedback taps, each of which carries a corrective weight derived based on a given sample of the received signal for application to subsequent samples.

Depending on the DFE delay (such as ¼ UI, ¾ UI), the first and most significant tap feeds back to correct the immediately following I sample and either its leading edge (early) Q sample, or its trailing edge (late) Q sample. Additional, less significant taps, may be fed back to respectively correct additional samples following thereafter. A DFE corrective weight is based on a DFE decision for the given sample—whether it was a one or a zero—so as to effectively model the channel interference content of the sample, and correct for what that channel interference does.

Figure 2A:
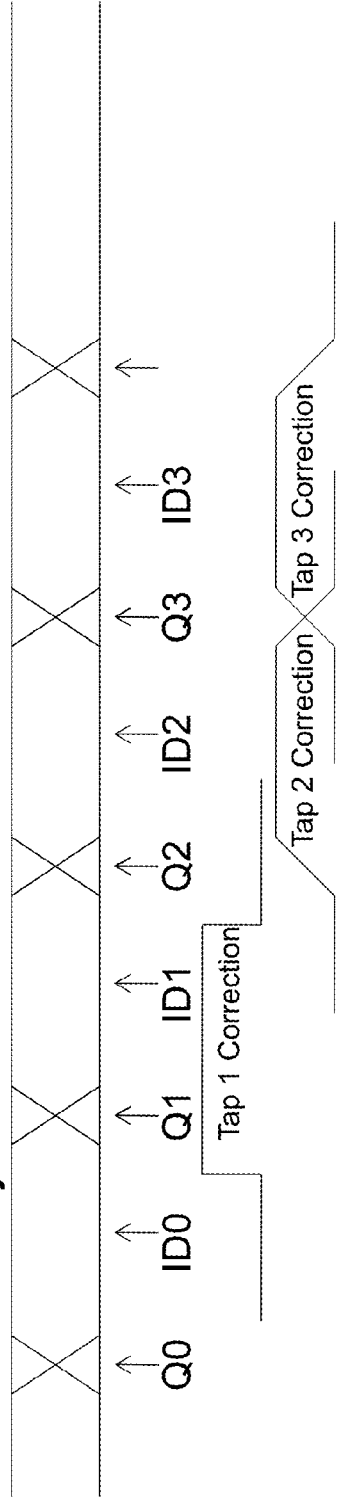
FIGS. 2A-2B are comparative timing diagrams schematically illustrating the juxtaposition of received signal samples, showing the relative timing of feedback equalization correction taps.
Figure 2B:
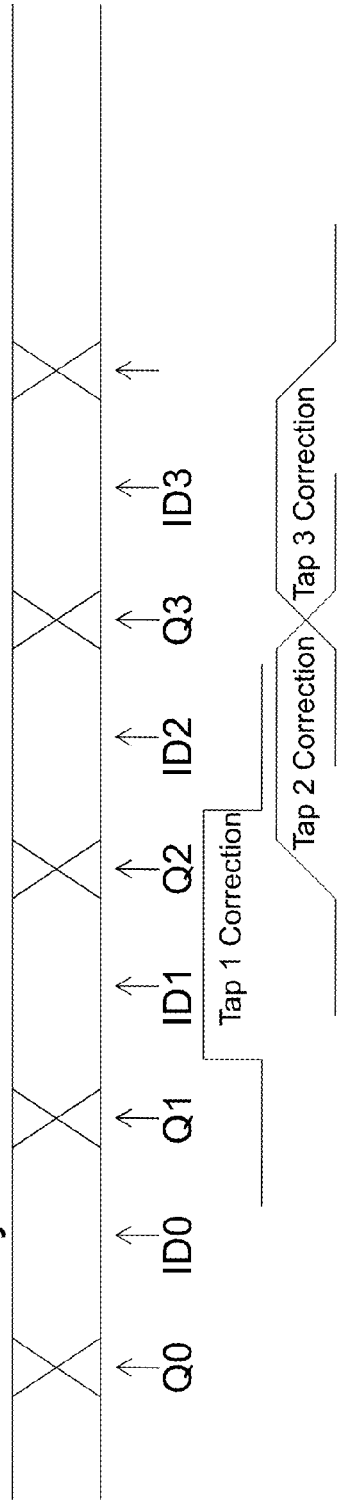

FIGS. 2A-2B comparatively show timing diagrams schematically illustrating a series of I and Q samples taken of an incoming received signal in two different cases. In the case of FIG. 2A, the timing diagram reflects the use of a 3-tap DFE whose tap 1 corrections are started after a ¼ UI delay. In the case of FIG. 2B, the timing diagram reflects the use of the same 3-tap DFE whose tap 1 corrections are started after a ¾ UI delay. The UI in each timing diagram represents the width of one data bit. Consecutive I samples in each timing diagram are labeled for the purposes of illustration ID0-ID3, and the intervening Q samples are labeled Q0-Q3. Q samples are disposed at the expected leading and trailing edges of a given I sample, and are taken at sampling times offset by ½ UI from the sampling times of that I sample.

If a logic state transition occurs between consecutive I samples, the voltage levels in those I samples will be sufficiently different to represent opposite logic states. The intervening Q sample will reflect an intermediate voltage level. This intermediate voltage level may be on one side or the other of a cutoff between logic-high and logic-low voltage levels depending on the extent of delay encountered by the signal in traversing the channel. If the transition arrives late, the Q sample's intermediate voltage level will still be on the same side of the logic level cutoff as the preceding I sample. If the transition arrives early, the Q sample's intermediate voltage level will have moved to the other side of the logic level cutoff and therefore be on the same side as the succeeding I sample. Theoretically, the transition may arrive precisely on time and thereby land exactly at the logic level cutoff voltage. In actual implementation, however, the circuit and system components employed are normally such that a timing determination is made for each transition that necessarily places it on one side or the other of the logic level cutoff.

FIGS. 2A-2B schematically illustrate the situation where the ID0 sample is considered by the given DFE. The DFE makes a logic level decision on the ID0 sample, then executes suitable processing (to carry out a least means square (LMS) algorithm) to determine the polarity and magnitude of the requisite DFE tap weights for corrective feedback. In FIG. 2A, the tap 1 correction, normally the most significant correction, is applied starting from ¼ UI after the ID0 sample is taken. The tap 1 correction is begun 'early' and thereby applied to the immediately following ID1 sample and its leading edge Q sample for removal of ISI effects therefrom. The less significant tap 2 and 3 corrections are applied as shown to further succeeding samples.

In FIG. 2B, the tap 1 correction is applied starting from ¾ UI after the ID0 sample is taken. The tap 1 correction is begun 'late' in this case and thereby applied to the immediately following ID1 sample and its trailing edge Q2 sample for removal of ISI effects therefrom. The immediately following Q1 sample is bypassed by the ID0 sample-derived correction. Again, the less significant tap 2 and 3 corrections are applied as shown to further succeeding samples.

The ¼ and ¾ UI delays for the 'early' and 'late' DFE corrections are but illustrative examples. For 'early' DFE correction of similar impact on the immediately following Q1 and ID1 samples the delay must generally be less than ½ UI. For 'late' DFE correction of the I sample and later-occurring Q sample, the delay must generally be between ½ and one UI.

Where the use of both the 'early' or 'late' DFE corrections is permissible, the choice of which generally will not directly impact results significantly, if at all, in terms of ISI correction (although the early/late choice may have certain significant indirect effect on ISI as described in following paragraphs). But the choice will directly impact timing recovery. If a 'late' DFE correction is used, the sampling phase tends to be later in time than if an 'early' DFE correction were used. A DFE, moreover, considers a sample and corrects for ISI in a sample occurring later in time, it corrects only for so-called post-cursor ISI. That is, a DFE corrects for ISI content in the received signal going forward from the reference signal sample (cursor) on which particular DFE tap weights were derived. It does not correct for pre-cursor ISI content which occurred in the signal prior to the reference signal sample, or cursor.

Use of the 'early' DFE correction approach is preferable for timing recovery purposes, and FIGS. 4A-4B help to schematically illustrate why. The curve in each FIG. reflects the ISI content in the received signal. FIG. 4A graphically illustrates a 'late' sampling phase example where the cursor sample 40a of the received signal is taken at a certain point in time, and its pre-cursor and post-cursor samples 42a, 44a are accordingly offset in time therefrom. FIG. 4B comparatively illustrates an 'early' sampling phase example, where corresponding samples 40b, 42b, 44b are shown shifted in time along the curve. As shown, the pre-cursor sample 42a taken with late sampling phase captures more ISI content than the pre-cursor sample 42b taken with earlier sampling phase. Using a ¼ UI DFE delay to correct the earlier of the following Q sample consequently tends to reduce this uncorrected pre-cursor ISI. This leads to a better, more open eye diagram for the corrected signal samples.

Figure 3A:
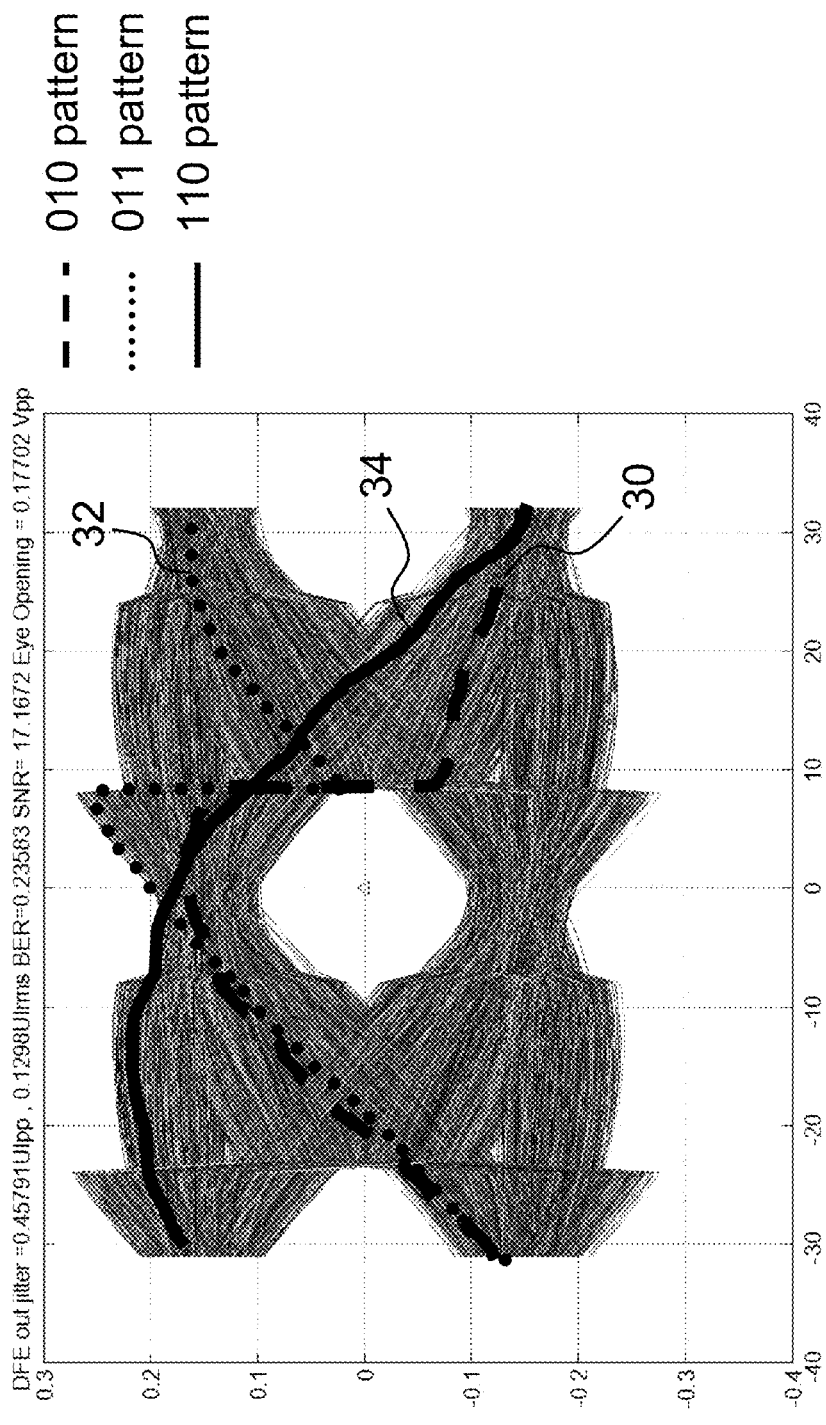
FIGS. 3A-3B are comparative eye diagrams of a signal segment illustrating the effect on signal traces of differently delayed equalization corrections.
Figure 3B:
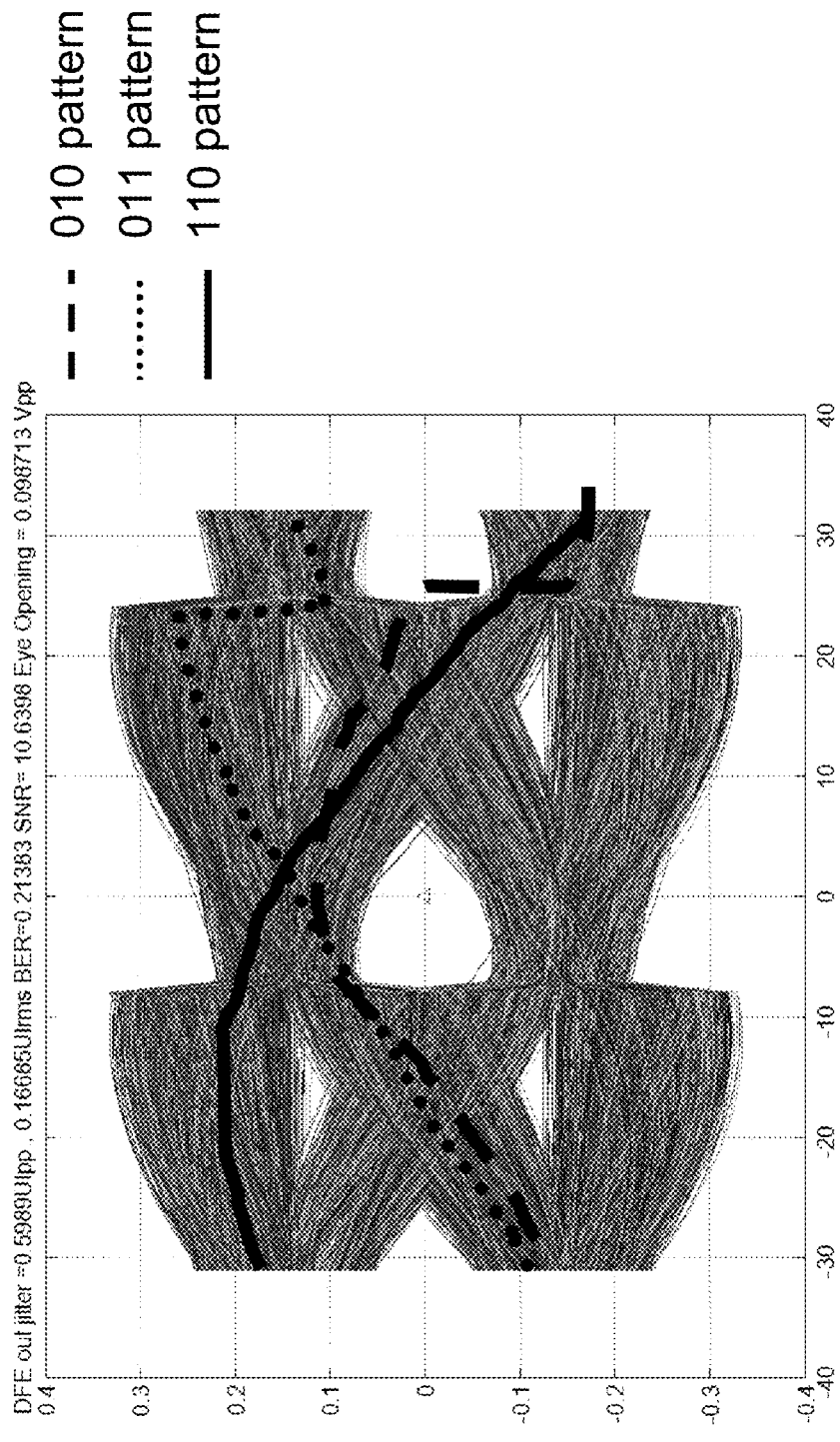

The eye diagrams of FIGS. 3A-3B are instructive in this regard. Each eye diagram is formed by a repetitively sampled set of captured timing curves for a segment of the received signal. In this example, the received signal is of differential signal type, and the 'eye opening' is defined by the voltage separation between the signal's complementary signal components.

These eye diagrams show the segments of signal traces generated using the same simulated system, except that for FIG. 3A a DFE was run with ¼ UI delay, while for FIG. 3B the DFE was run with a ¾ UI delay. The eye diagram in the case of FIG. 3B shows considerably greater closure of the eye than in FIG. 3A, though the applied DFE corrections may not be as drastic as in FIG. 3A. It is apparent that while phase information may be more stable with this DFE correction of the late Q sample as shown in FIG. 3B, it is less reliable than with early Q sample DFE correction as shown in FIG. 3A.

As noted, timing recovery may be affected quite detrimentally by the occurrence of excessive DFE or other equalization correction on a signal sample where an edge, or logic state transition, is detected. Typically, a logic high state is represented by a positive voltage level, and a logic low state is represented by a negative voltage level (such as +1V and −1V in a system application utilizing differential signals, for example). Where a zero-crossing transitional edge is sampled, and that transitional edge reflects a DFE correction, there is ambiguity as to whether that zero-crossing was actually due to proper signal content or due instead to the DFE correction applied thereon. The ambiguity is heightened to prohibitive extent where the DFE correction approaches or even exceeds one half of the voltage range high and low logic states (see annotated traces in FIG. 3A).

In accordance with certain aspects of the present invention, distortions in phase due to such equalization corrections causing artificial transitional edges is effectively filtered out. That is, an otherwise positive detection of a transition/edge occurring between signal samples is suppressed if the detected transition relates to a signal sample found to have been subjected to equalization correction from the DFE. A graphic example of this is illustrated in FIG. 3A, which shows an eye diagram for a segment of the received signal plotted to extend across 64 time increments. In this example, the UI is set at 32 time increments in length (or 32 sampling increments for this diagram), and the signal is subjected to a DFE applied with ¼ UI delay. I samples are taken at times −32, 0, 32, and corresponding Q samples are taken at times −16 and 16 to yield numerous traces, including a graphically annotated DFE corrected trace 30 delineating a logic 010 pattern, another DFE corrected trace 32 delineating a logic 011 pattern, and an uncorrected trace 34 delineating a logic 110 pattern.

The mid I sample (at time 0) of each DFE corrected trace 30, 32 is preceded by a transition from the preceding I sample (at time −32). This contributes largely to a subsequent DFE correction at time 8 (delayed ¼ UI from time 0) which is excessive. The correction spans nearly half the peak-peak range between high and low state voltages. In the case of trace 32, the correction is ineffectual because it does not cause enough drop in amplitude to cause a zero-crossing (though it comes close). Hence, there is no transition and therefore no positive transition detection. But in the case of trace 30, the equalization correction does cause enough drop in amplitude to generate a zero-crossing transition. If not for this correction-induced discontinuity, the further progression of the signal clearly would not have caused such zero-crossing within the window shown. In other words, the DFE applies an excessive large tap(s) to the signal sampled at times 16 (Q sample) and 32 (I sample) that the transition to that I sample at time 32 is artificial, and reflects corrupted timing information. The subject system and method discards such corrupt information, selectively suppressing its use for phase detection.

The edge produced by trace 30 is solely due to the timing of the DFE correction and has nothing to do with the timing of the incoming signal. The DFE correction is set in timing by the recovered clock that the CDR controls. With a ¼ UI delay, the edge occurs early. The early edge tends to drive the recovered clock earlier which in turn tends to moves the edge to occur earlier. If a constant 1010 pattern were to be received with a large amount of DFE correction, timing recovery would fail.

Preferably, any DFE correction applied to a signal sample at which a logic state transition may be detected is presumed to have been excessive enough to cause an errant transition in one exemplary embodiment (such as described in following paragraphs). This is a simplified approach which effectively carries out pattern filtering on the observed pattern of logic state transitions between respective pairs of preceding and current I samples. Where the pattern indicates consecutive transitions, the currently detected transition is presumed to be corrupted for timing purposes by an equalization correction and accordingly discarded.

There may be legitimate transitions in data occurring at those signal samples where a DFE correction is applied, the occurrence of which transitions may not have been altered or obscured materially by the DFE correction. Suitable measures may be provided in certain alternate embodiments to ensure that the transition detections in those cases are not suppressed. For example, the degree of equalization correction applied may be subjected to a suitable thresholding check to permit the use of the transition detection information in where the equalization correction is not deemed excessive. This may replace or supplement the logic state pattern filtering employed in the exemplary embodiment disclosed.

In many applications, however, the effect (of discarding some uncorrupted transition detections along with corrupted transitions) on overall gain of a given phase detection system is not significant enough to justify the added cost and complexity of such optimization. Also, other readily known factors in particular applications—factors such as general channel quality, the amount of equalization correction typically applied during receiver operation, and the like—will provide reliable indication of whether the simplification of the pattern filtering approach is a justifiable tradeoff.

The pattern filtering does not have a large effect on phase detector gain in certain systems for the reason that most CDR's operate on several timing samples at a time, each at a rate lower than the effective sample rate. For example one may operate on 4 samples/UI at a ¼ rate. Typically, the set of early/late samples is reduced to a single early/late sample by majority vote where the set is considered early if the number of early samples exceeds the number of late samples. In this case, if some of the early samples were discarded with pattern filtering, then it would be only slightly less likely to contain useful timing information than in the case where all up/down signals are used (it is only slightly less likely that a set of 4 up/down signals contains no timing information compared to the case of all up/down signals being used).

Figure 5:
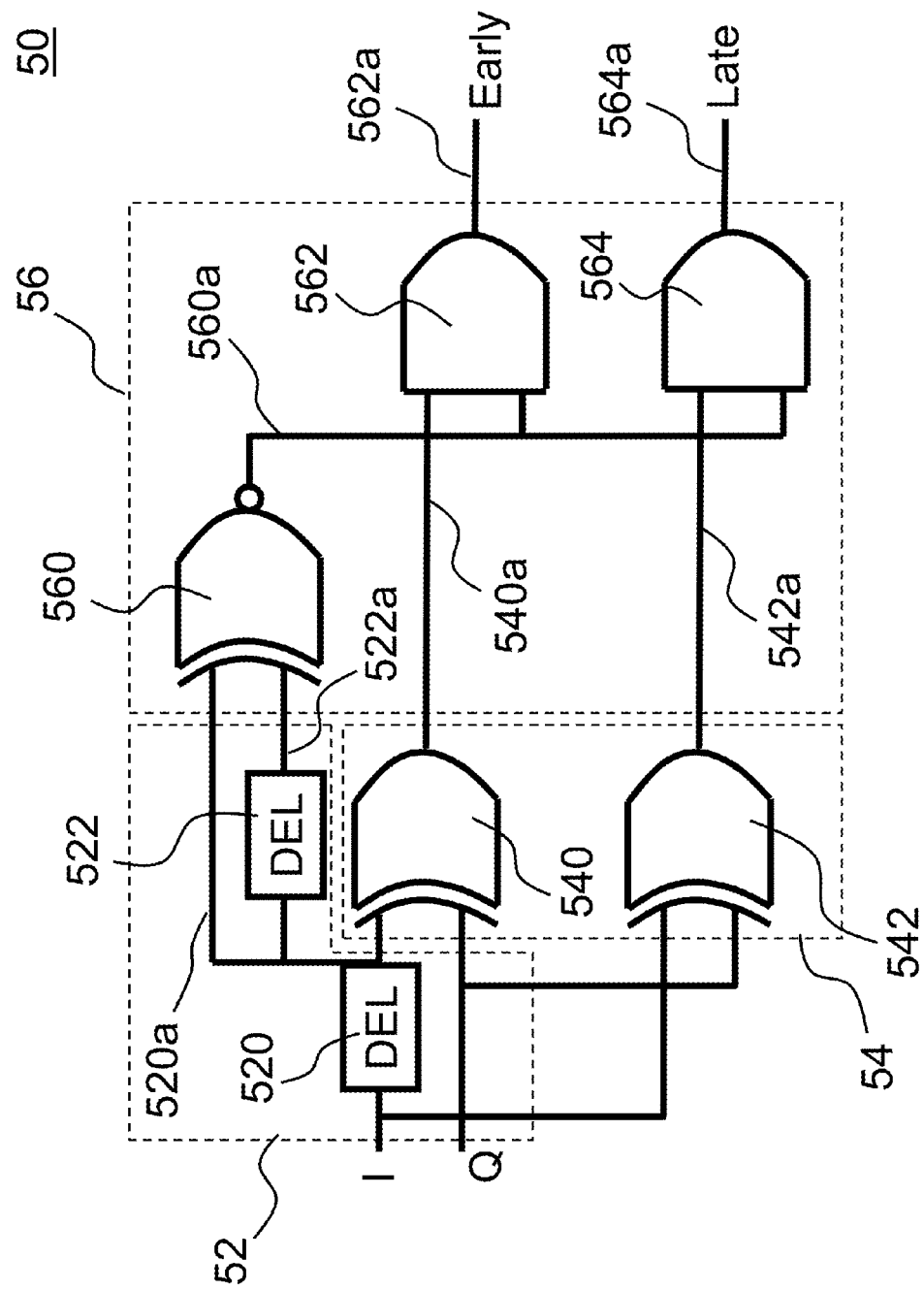
FIG. 5 is a simplified schematic diagram illustrating a phase detector circuit formed in accordance with one exemplary embodiment of the present invention.

FIG. 5 illustrates in simplified schematic form a phase detector 50 formed in accordance with one exemplary embodiment of the present invention. Preferably, phase detector 50 may be suitably configured to selectively disable the pattern filtering function when necessary. While not shown in FIG. 5, phase detector 50 may be reconfigured, for example, to include a multiplexing device at the output of the equalization detection portion 560 (described in following paragraphs), with at least two inputs and a control signal. One input may be fed by the portion 560, while the other input may be tied to a preset logic level (such as a high logic level). When the control signal selects the logic high input, the pattern filter would be disabled. Accordingly, during modes of operation where the DFE is disabled, the pattern filtering functions may then be disabled as well. Such disabling control may also be used in conjunction with a mechanism that automatically disables pattern filtering when the DFE tap 1 correction is determined to be sufficiently small. It would also be useful during test modes where a fixed 1010 . . . pattern is to be used.

Turning more closely to FIG. 5, the phase detector 50 shown is but one example of numerous embodiments by which the present invention may be implemented. Phase detector 50 is preferably formed as part of a receiver's timing recovery measures, such as illustrated by the digital clock recovery block 18 of the receiver 1 in FIG. 1. Timing recovery involves among other things the detection of signal transitions, so that the received signal's phase information may be recovered. In accordance with certain aspects of the present invention, phase detector 50 operates to make such transition detections from the I and Q samples of the received signal, preferably with additional indication as to whether the transition was early or late in arrival at the corresponding Q sample time.

Phase detector 50 carries out a check of the transition detection for possible corruption due to excessive equalization correction. In this illustrative embodiment, phase detector 50 is configured to do this via pattern filtering which determines if the currently detected transition in logic state was immediately preceded by another transition in logic state. If so, the currently detected transition information is deemed to have been corrupted and accordingly discarded. The phase detection process thereby suppresses new timing information for the given sample, and takes suitable measures depending on the particular requirements of the intended application to allow the process to carry on (such as relying on timing information stored in memory to 'coast' through the momentary void in newly acquired timing information).

Phase detector 50 includes in this embodiment a sample acquisition unit 52 that periodically receives I and Q samples of the received signal from a deserializer or other suitable portion of the receiver. Assuming the use of 'early' DFE correction, the Q sample is preferably taken to cover the leading edge of the currently received I sample. The sample acquisition unit 52 includes one or more delay portions 520, 522 such that time-offset samples of the received signal are made available for selective mutual comparisons. At a certain state of operation, for instance, if phase detector 50 receives a current I sample ID0 at its input node, the delay portion 520 would have delayed a first preceding I sample ID1 to now appear at line 520*a*. The delay portion 522 would have additionally delayed an even earlier second preceding I sample ID2 to now appear at line 522*a*.

Phase detector 50 also includes a transition detection unit 54 coupled to the sample acquisition unit 52, which receives the ID1, ID0 and Q samples amongst its inputs. The transition detection unit 54 preferably includes an early transition detection portion 540 and a late transition detection portion 542, which respectively generate first and second transition detect signals responsive to comparisons of the preceding ID1 and Q sample on the one hand, and of the preceding current ID0 and Q sample on the other. Each of the early and late transition detection portions 540, 542 is preferably implemented using an exclusive OR gate circuit as shown. The first transition detect signal is then actively triggered on line 540*a* only when the first preceding I sample ID1 and the current Q sample are different, indicating that the transition arrived early enough at the Q sample to have already changed its value to the other logic level value. Conversely, the second transition detect signal is actively triggered on line 542*a* only when the current I sample ID0 and the current Q sample (at its leading edge) are different, indicating that the transition arrived late enough at the Q sample that the Q sample value at the time of its sampling had still not changed (to the value reflected at sample ID0).

Phase detector 50 additionally includes a transition filtering unit 56 coupled to the sample acquisition and transition detection units 52, 54. The transition filtering unit 56 is preferably formed in this embodiment with an equalization detection portion 560 and a filtering portion 562, 564 coupled thereto. The equalization detection portion 560 is preferably implemented using an exclusive NOR gate circuit as shown which generates an equalization detect signal on line 560*a* responsive to comparison of the first and second preceding I samples ID1 and ID2. This equalization detect signal is triggered to suppress a transition detection made by the transition detection unit 54 when the ID1 and ID2—so as to selectively mitigate potential corruption in that transition detection—only when the two preceding samples ID1 and ID2 are different to indicate a prior transition therebetween. Because the equalization detection portion 560 is configured to filter out upon logic-AND'ing with the early/late transition detect signals of lines 540*a*, 542*a*, it is provided as a normally high signal which goes low when the triggering condition (of differing ID1 and ID2 samples) is met. Again, the pattern of a currently detected transition immediately following a prior transition is preferably, though not necessarily, taken as indication of excessive, corruptive equalizing correction of the received signal having occurred at the ID0 sample.

The filtering portion of unit 56 is preferably implemented in this embodiment using a combination of AND gate circuits 562, 564 which receive the equalization detect signal on line 560*a* along with the respective early and late transition detect signals on lines 540*a*, 542*a*. The early and late transition detect signals when triggered high on lines 540*a*, 542*a* are appropriately passed by the respective AND gates 562, 564 to the output lines 562*a*, 564*a*—so long as the output of exclusive NOR gate 560 indicates a common logic state for the preceding samples ID1, ID2. The early and late transition detect signals are blocked by the AND gates 562, 564 otherwise (that is, when the preceding samples ID1, ID2 are different in logic state).

The various units and components forming phase detector 50 may be suitably implemented in hardware, software (by programmable implementation in computer readable memory for execution in one or more computer processors), or a combination of both. The choice of implementation will depend on the particular requirements of the intended application, and any suitable measures known in the art may be employed consistent with the disclosures herein.

The truth table shown in FIG. 6 illustrates one example of the pattern filtering approach carried out by phase detector 50 to selectively/adaptively mitigating corruption in timing information. In this example, the logic states of each preceding I sample ID2, ID1, current I sample ID0, and the early (or leading edge) Q sample of the current ID0 sample are indicated by logic 0 or logic 1. The results of transition detection made by a conventional phase detector and by phase detector 50 of FIG. 5 ("Corruption-Mitigated") are comparatively shown.

Among the different operational states shown, state 60 illustrates a situation where a transition is detected between the current I sample ID0 (1) and its first, immediately preceding I sample ID1 (0). The Q sample (0) therebetween indicates that the transition is late, since the value at Q is the same as that of the preceding sample ID1. This is properly indicated by the conventional phase detector as "−1." Since the logic values of the preceding samples ID2, ID1 indicate no prior transition, the corruption-mitigated phase detector likewise indicates the "−1" detection of late transition. A similar situation is illustrated at state 62, except that the current sample transition is detected early, as indicated "+1" by both the conventional and corruption-mitigated phase detectors.

In contrast, at state 63, an early transition "+1" is detected by the conventional phase detector. But a prior transition did occur between the preceding samples ID2, ID1. Consequently, the corruption-mitigated phase detector 50 suppresses the current transition detection, indicating a detection value of "0" as shown. The corruption-mitigated phase detector 50 similarly suppresses transition detections which would otherwise be made at states 65, 67, 69, so as to mitigate potential corruption due to excessive equalization correction for the current I and Q samples of the received signal.

As a practical matter, the idea of executing the processes required to carry out the DFE correction and the corruption-mitigated phase detection for accurate timing recovery, all within the relatively short processing time available, is questionable. This is especially so, when a short DFE delay on the order of ¼ UI is used. Indeed, it is not practicable in most applications. With typical DFE implementations, there is not enough time to sample the received signal, generate the DFE tap weights, feed them back, and add them back in to the receiver. Suitable measures are known in the art, however, such as the use of loop unrolling DFE, speculative DFE, or the like. These approaches generally defer the decision of whether a plus or minus correction is appropriate for a given sample, and simply correct both ways. The appropriate choice of correction is determined later, when time is sufficiently available. That is sufficient in most cases to make the processing required for the disclosed corruption-mitigated phase detection tenable, even with the short turnaround timing required by early DFE correction.

An example of a loop unrolling DFE in a receiver 1 such as shown in FIG. 1 is illustrated in FIG. 7. In this example, a DFE tap 1 is controlled by either the error at the center of the given sample's eye diagram (with the preferred amplitude-based DFE algorithm), or the zero crossing (zero crossing-based DFE algorithm). The LMS-based zero crossing algorithm employed by the DFE correlates the error at the zero crossing by the data sample occurring 1.5 UI earlier. The LMS-based amplitude algorithm correlates the error sample with the data sample occurring 1 UI earlier. DFE taps 2 and 3 use only the amplitude algorithm, since the DFE feedback tap delay has enough variability for the feedback to occur just to the right, or just to the left, of the next zero crossing. This can cause instability in the zero crossing algorithm on these taps. The time constants for the tap weights are preferably set using an update (mu) factor; and the range of the taps weights is clipped at a maximum of half of the target signal amplitude height.

In a representative example, tap 1 has a weight of 4 mV per step, with +−31 steps. Taps 2 and 3 have a weight of 3 mV per step, with +31 steps. The Error Sampler Threshold has an adjustable range from ~150 mV to ~250 mV, in 8 mV steps, and is adaptively controlled. The DFE and clock and data recovery (CDR) blocks are separated digitally using a filter, with negligible power or area penalty. This separation is by-passable. An 8 Gb/s long-channel eye opening is found to improve with the pattern filter of the phase detector 50 of FIG. 5 activated.

Test Results

The efficacy of a receiver employing DFE which implements phase detector 50 in its phase recovery (with "new phase detector") is demonstrated by comparative simulation runs made on that receiver, and on similar receivers with conventional phase recovery (with "old phase detector"). The simulation runs were made using a transmission channel with 32 dB attenuation at ½ the sample rate relative to the attenuation at low frequency, and with the receiver employing a conventional continuous time linear equalizer (CTLE) that produces some equalization but yields a barely closed eye diagram. In each run, a 1010 pattern 1,000 UI (bits) long was transmitted to the receiver after every 100,000 UI string of random value transmissions. Various aspects of phase recovery performance were then comparatively analyzed for the following receiver configurations: (1) using a ¼ UI DFE delay with the old phase detector; (2) using ¾ UI DFE delay with the old phase detector; and (3) using a ¼ UI DFE delay with the new phase detector.

FIGS. 8A-8D respectively illustrate for the first case (¼ UI DFE delay with the old phase detector) graphic plots obtained from simulation runs, namely graphic plots of: the sampling phase (UI vs. sample), the DFE tap 1-tap 5 corrections (tap value vs. sample), the eye diagram at the output of the CTLE (voltage vs. UI), and the collected I sample values from the eye diagram at the DFE output (voltage vs. sample). FIGS. 9A-9E illustrate similar graphic plots of the same parameters for the second case (using ¾ UI DFE delay with the old phase detector), with an additional plot of the eye diagram at the output of the DFE, showing DFE correction transitions. FIGS. 10A-10E illustrate similar graphic plots but for the third case (using a ¼ UI DFE delay with the new phase detector).

As FIGS. 8A-8D indicate, when an alternating 1010 pattern is transmitted through the channel to a receiver using a ¼ UI DFE delay with the old phase detector, its CDR loses lock and takes considerable time to recover. These long periods of time during which the CDR is out of lock causes problems with convergence of the DFE. The resulting signal-to-noise ratio (SNR) may not be overly bad while the CDR is locked, but the peak-peak noise is found to be unacceptable for most applications.

Additional simulation runs on the same receiver configuration with only random data (without alternating 1010 pattern interjections), indicate similar problems with this channel. Thus, even with no alternating 1010 pattern deliberately interjected, both the CTLE the CDR in this channel exhibit problems tracking. Initially, the CDR converges. But the data pattern transmitted during the simulation runs eventually causes the CDR to cycle slip. Even while the CDR is converged, the phase jitter is excessive and yields regions where I samples are severely degraded. The SNR is not excessively bad, however, since the average phase is correct.

FIGS. 9A-9E reveal that for a receiver configuration using ¾ UI DFE delay with the old phase detector, the CDR is found to be relatively stable, but the sampling phase is wrong. This degrades both the SNR and the height of the eye opening.

As FIGS. 10A-10E indicate for a receiver configured to use a ¼ UI DFE delay with the new phase detector, the CDR sampling phase remains substantially insensitive to the alternating 1010 data pattern interjection in the transmitted data. Nor is there undue phase shift or degradation found in the SNR or eye opening height. The sampling phase is much improved compared to a channel using a ¾ UI DFE delay, even with the same phase detector.

Figure 8A:
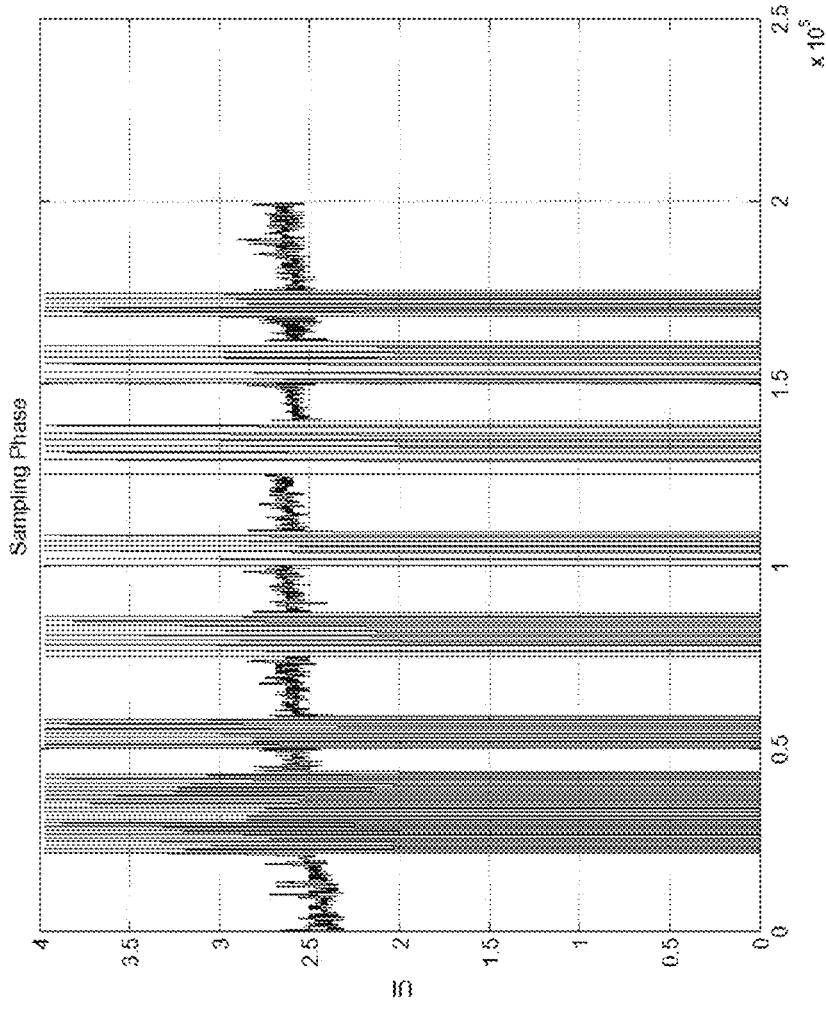
FIGS. 8A-8D are illustrative graphic plots for certain parameters obtained from simulation runs on a conventional receiver using ¼ UI DFE delay.
Figure 8B:
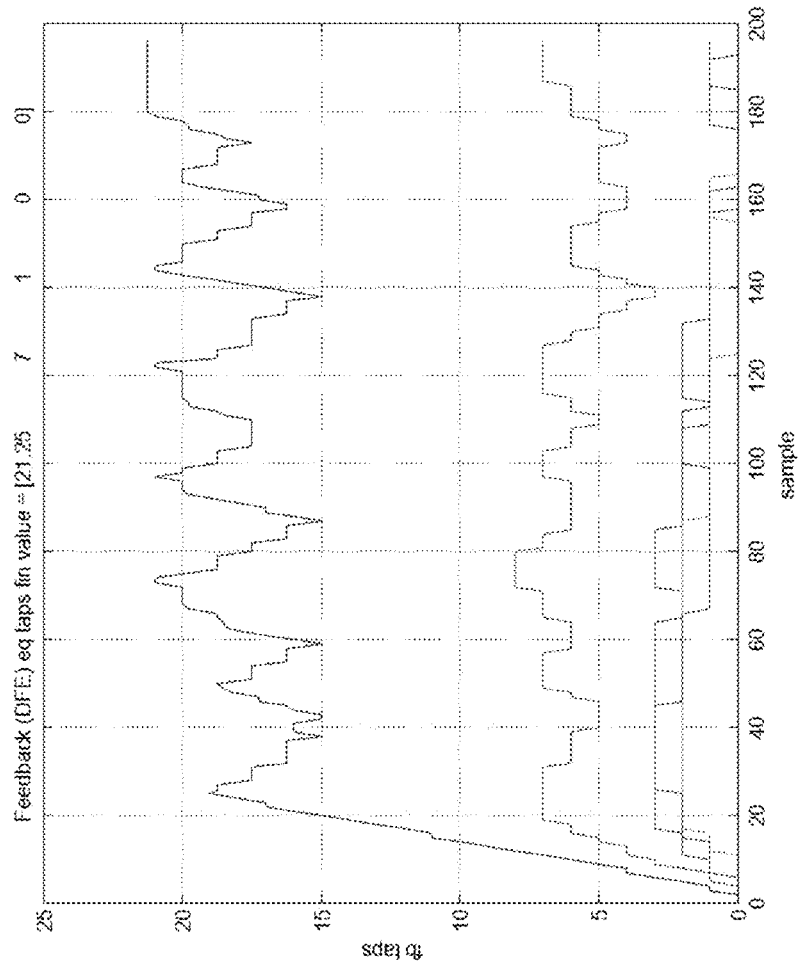
Figure 8C:
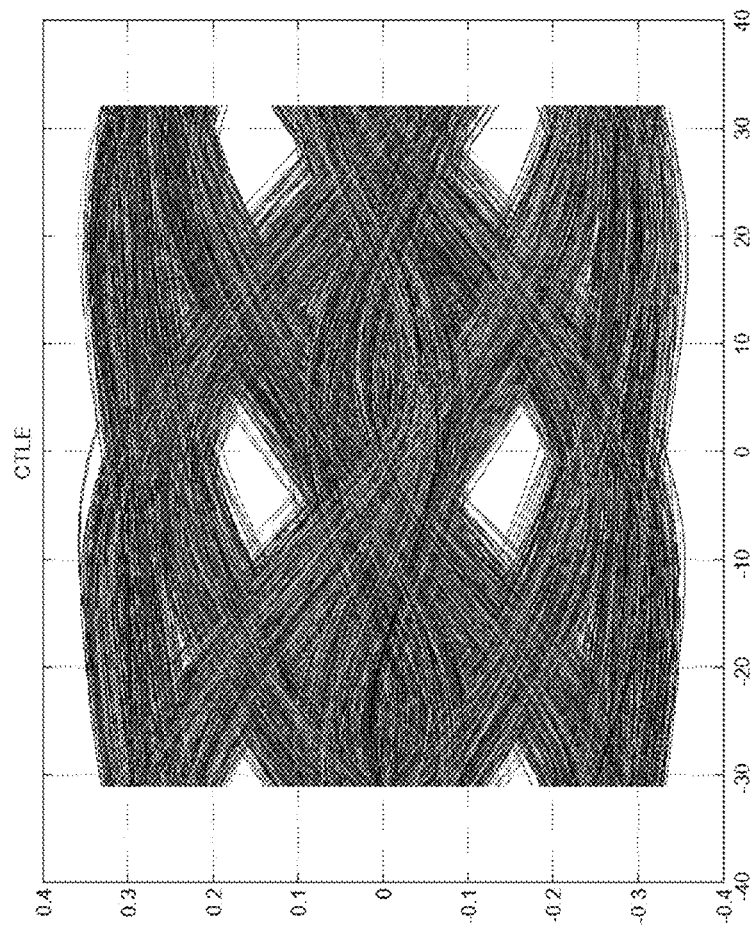
Figure 8D:
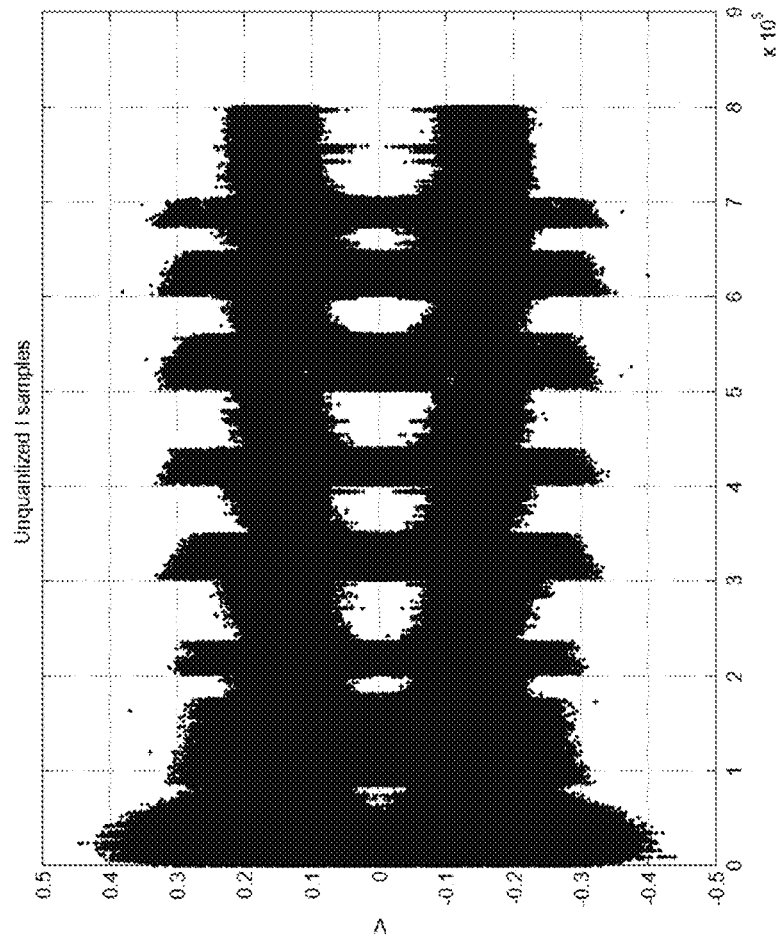
Figure 9A:
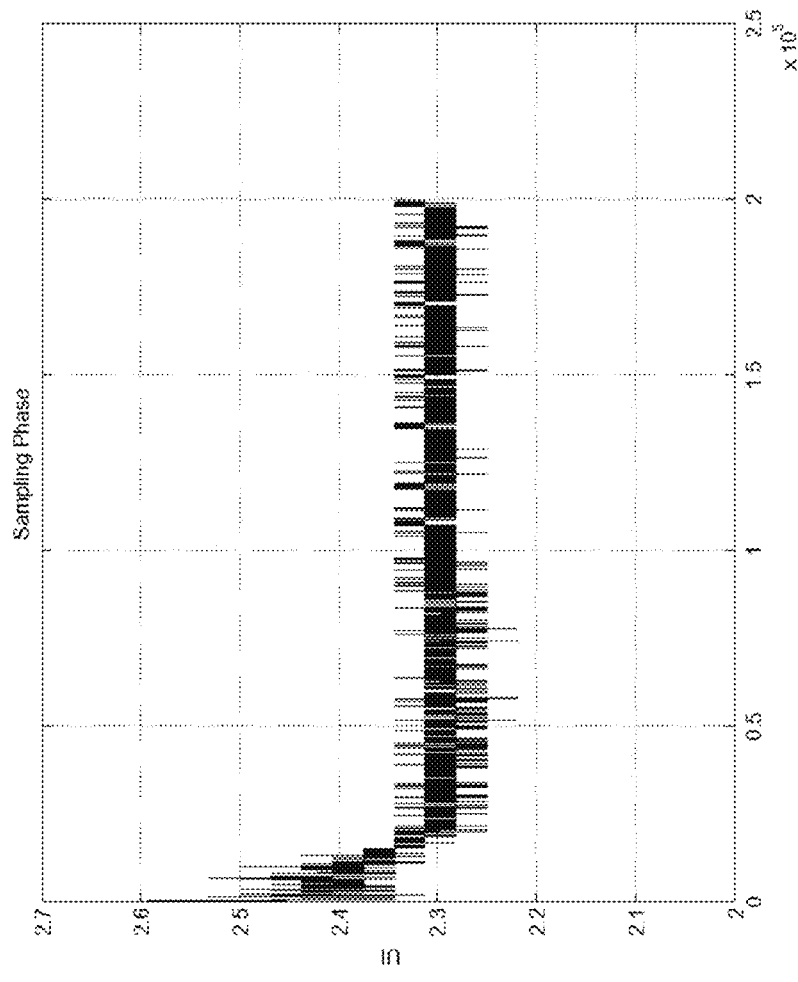
FIGS. 9A-9E are illustrative graphic plots for certain parameters obtained from simulation runs on a conventional receiver using ¾ UI DFE delay.
Figure 9B:
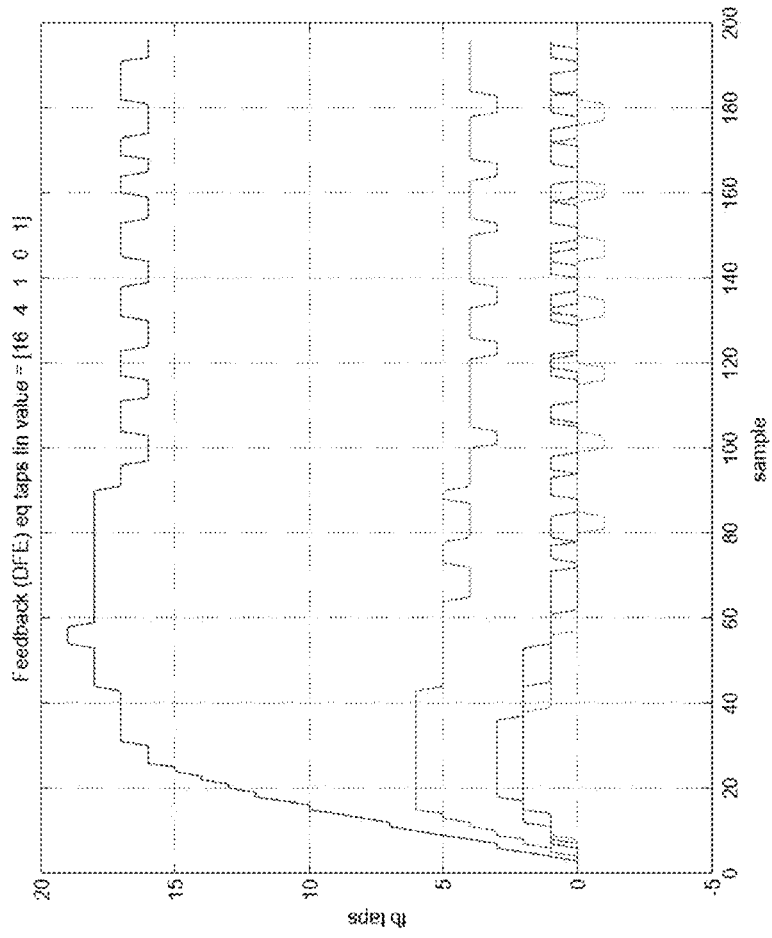
Figure 9C:
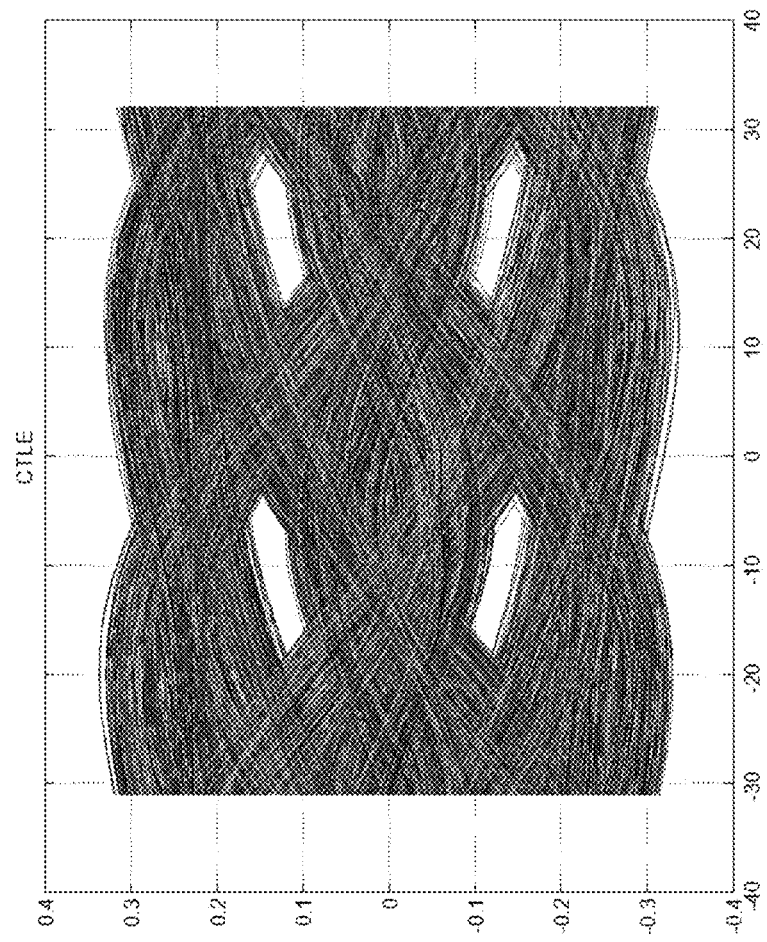
Figure 9D:
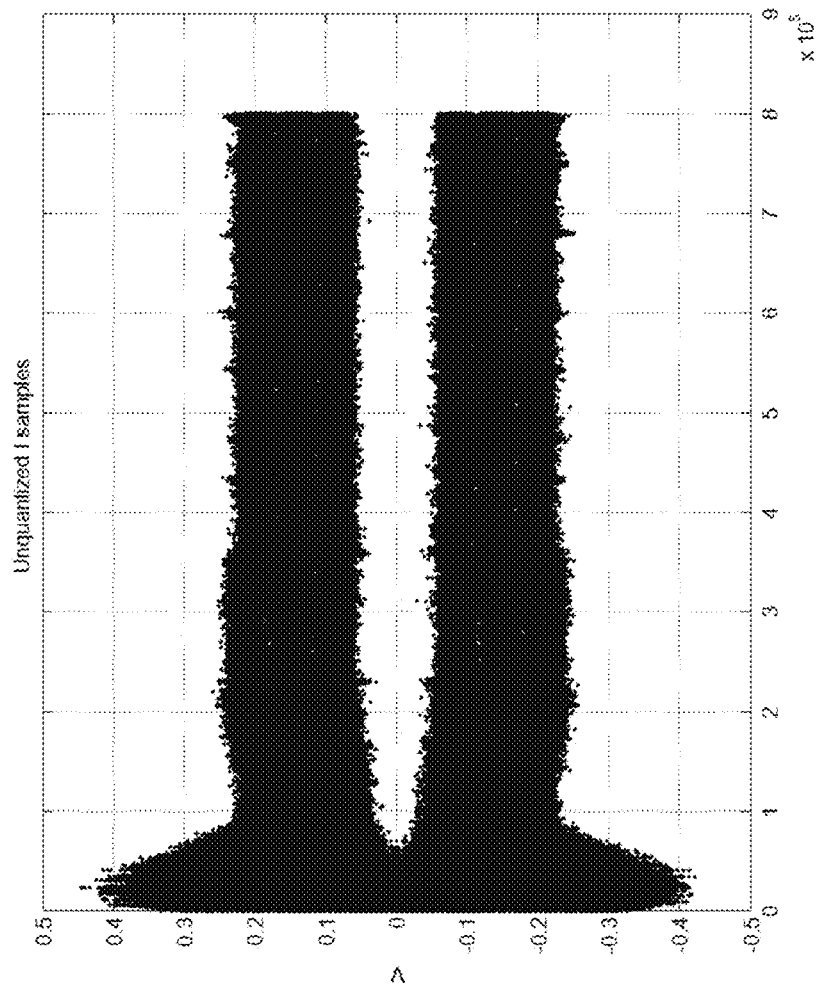
Figure 9E:
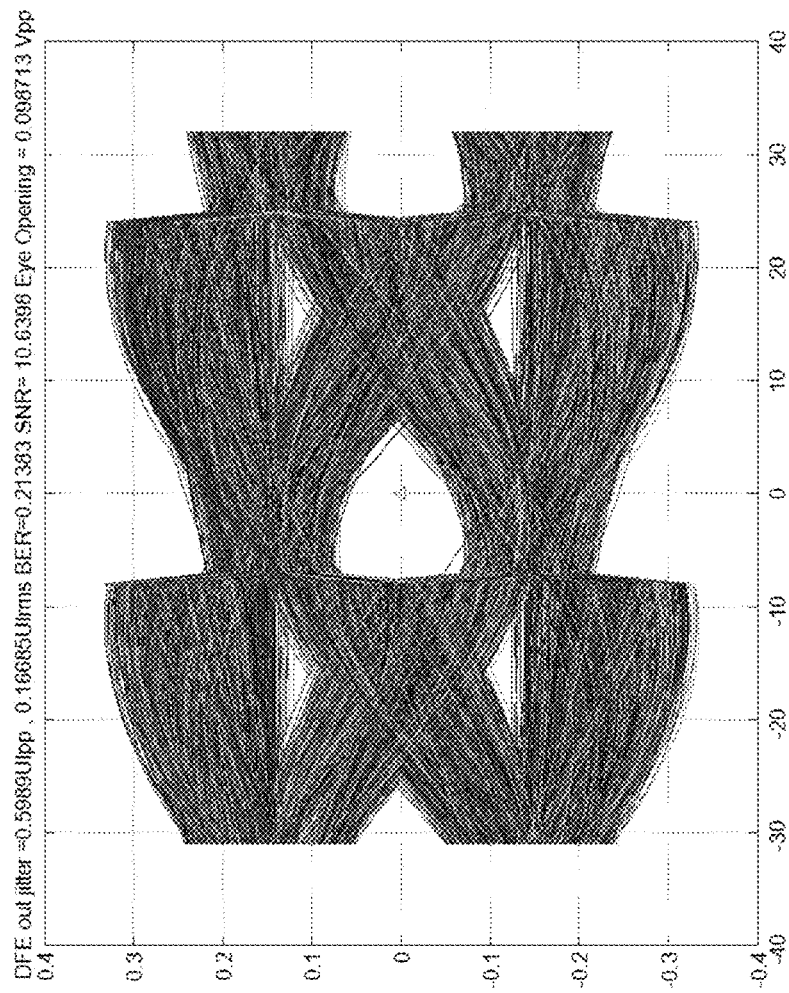
Figure 10A:
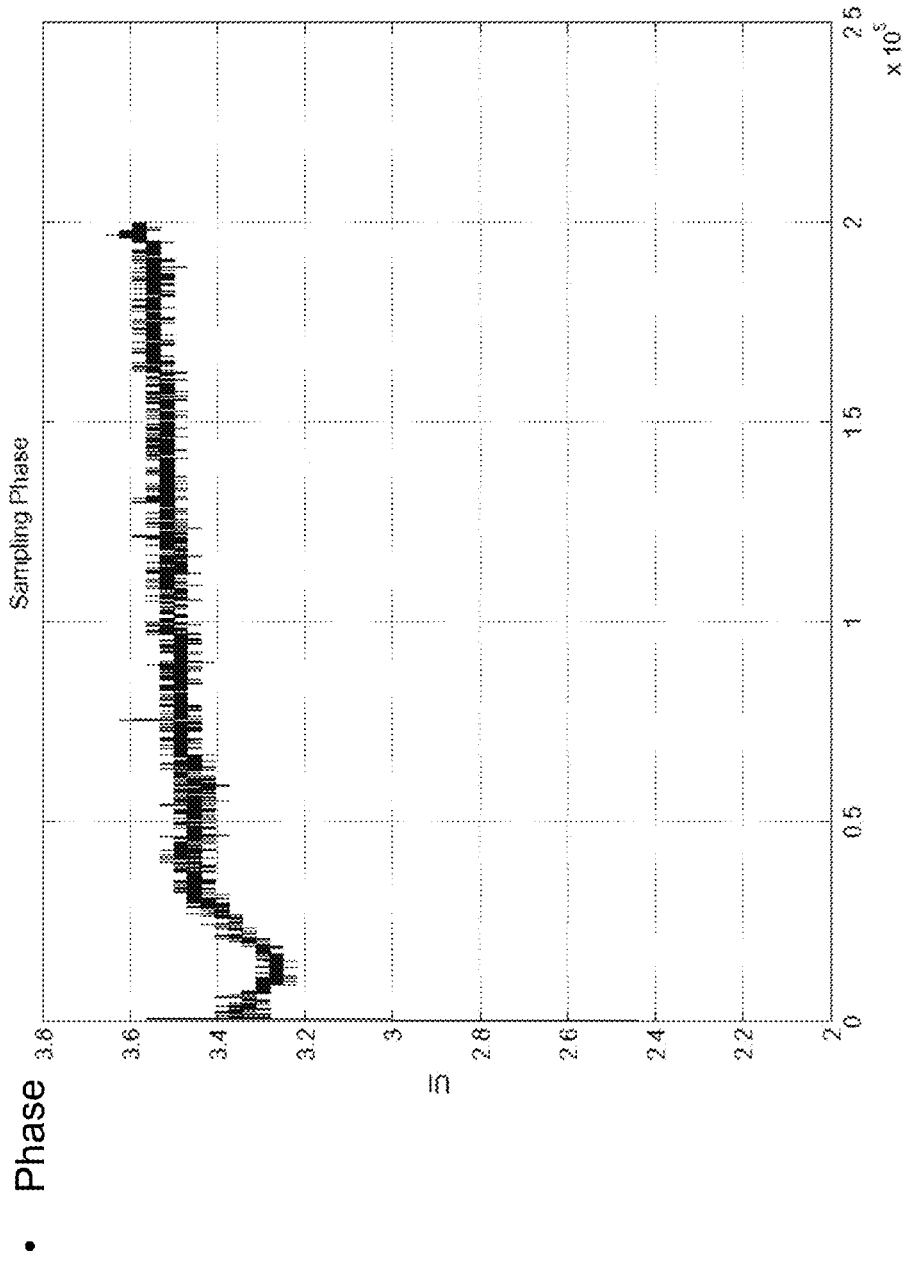
FIGS. 10A-10E are illustrative graphic plots for certain parameters obtained from simulation runs on a receiver incorporating the exemplary phase detector embodiment illustrated in FIG. 5, configured to use ¼ UI DFE delay.
Figure 10B:
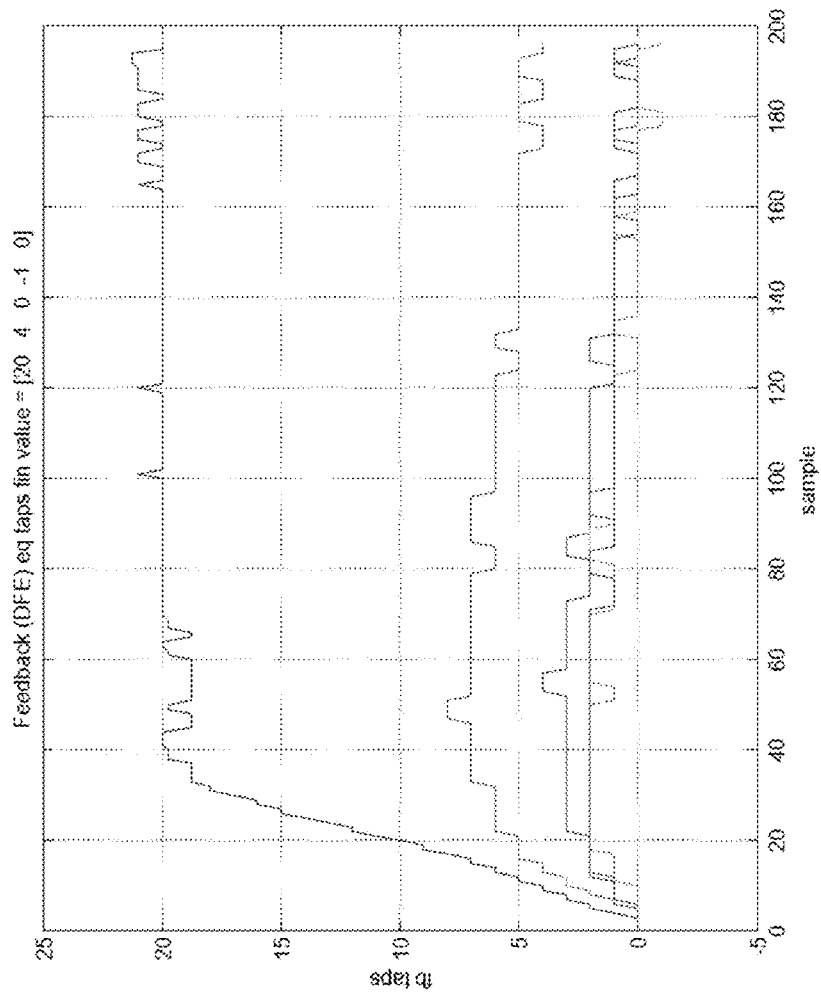
Figure 10C:
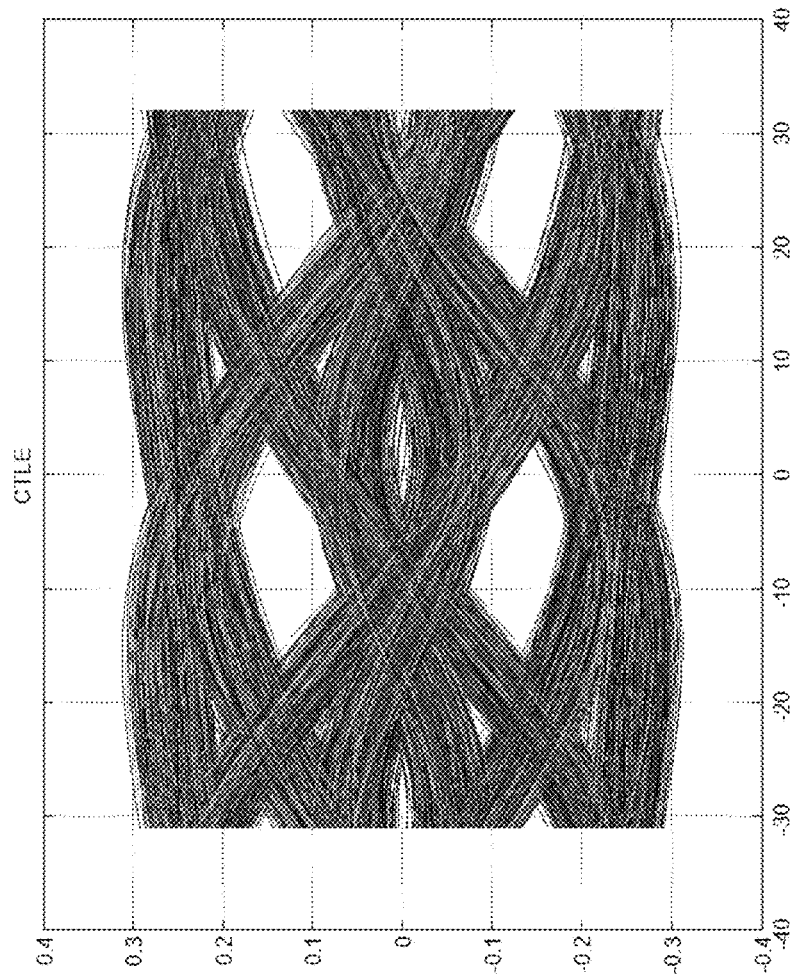
Figure 10D:
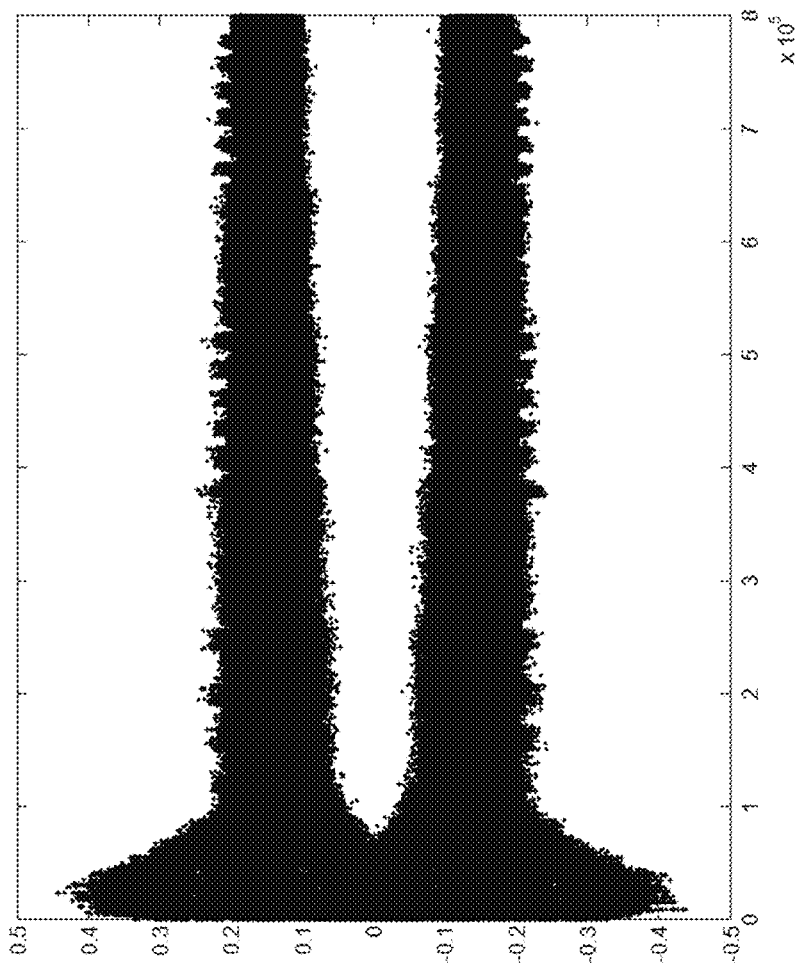
Figure 10E:
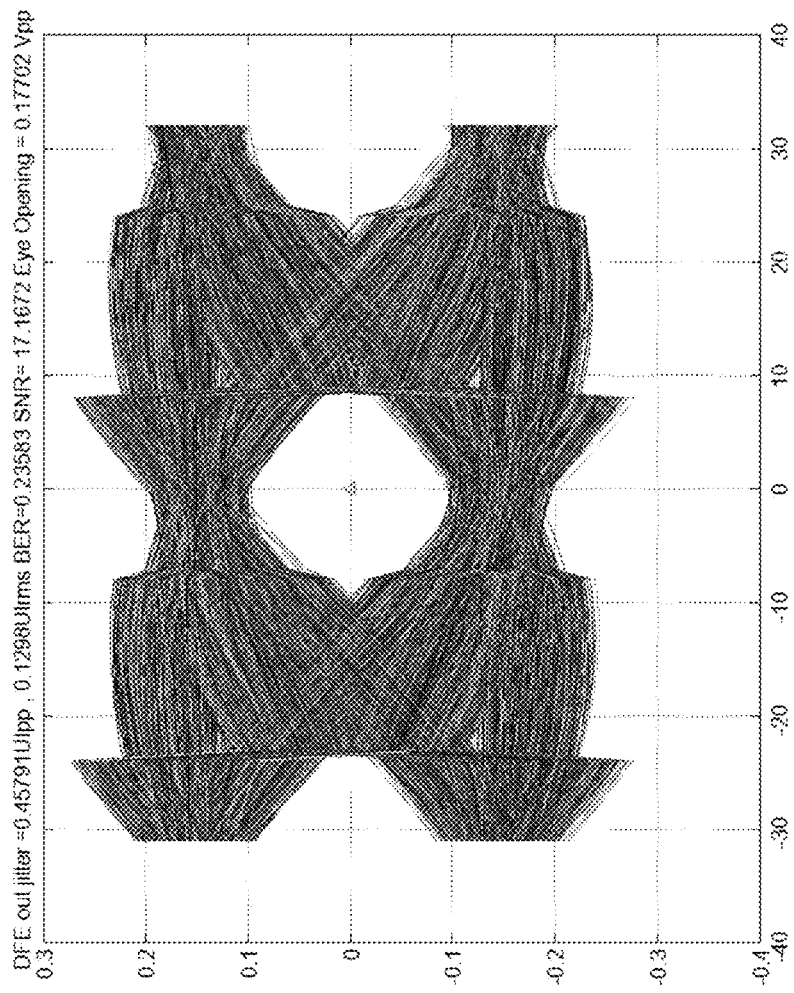

Regarding the plots of the collected I sample values shown in FIGS. 8D, 9D, and 10D, the plotted points are the values repeatedly captured for the I sample (that is, at the center of the eye diagram at the DFE output in the illustrated example). The upper and lower horizontal legs indicate the high and low levels of the samples repeatedly captured over time. The separation of these legs from the zero level between them provides a graphic indication of how well the sample values are converging and how much error margin is maintained. The farther away the legs are from zero, the more the corresponding eye diagram has opened up. Since equalization is adaptive the early samples are prone to much error, as indicated by the merging of legs there. As the system stabilizes, sample values gradually converge to respective levels, and depending on the efficacy of the DFE correction and phase detection a distinct, preferably even growing, separation is maintained between the legs.

Figure 11:
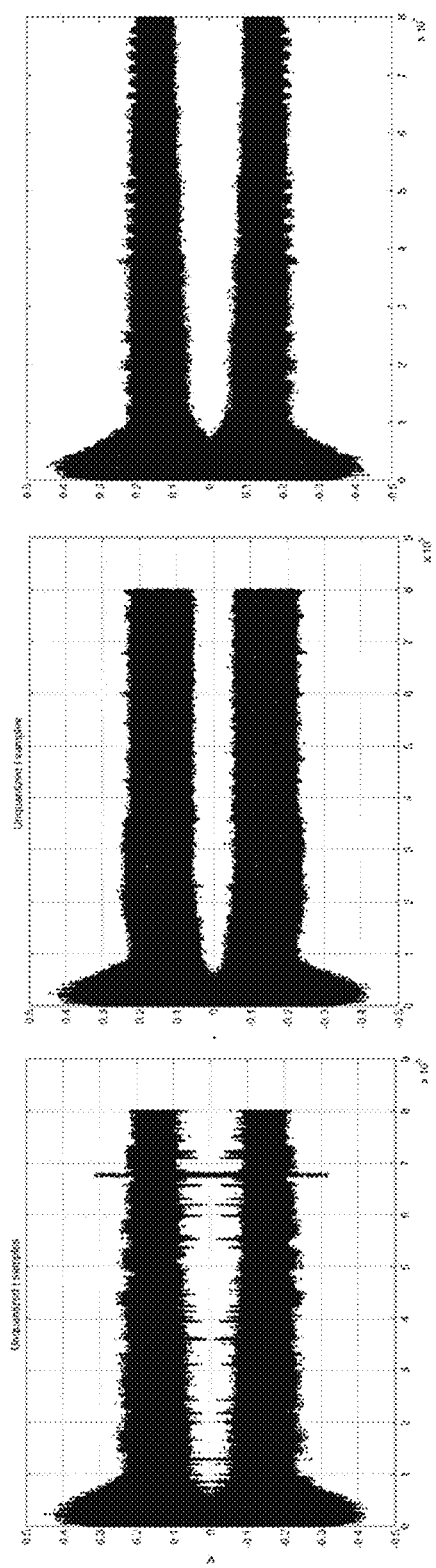
FIG. 11 is a comparative side-by-side presentation of I sample diagrams of FIGS. 8D, 9D, and 10D.

FIG. 11 comparatively shows the corresponding I sample diagrams for each of the three cases (1)-(3). The receiver channel using the new phase detector exhibits significantly reduced interaction between the DFE and CDR, as indicated by the legs' widening error margin and expanded eye opening height, compared to the other cases.

Various enhancements may be incorporated in alternate embodiments of the present invention to adequately address certain situations. For example, pathological 1010 patterns may occur over extensive time periods with a spread spectrum input, such that the given phase detector would coast its loop filter. Extensive analyses of data patterns normally occurring in various data communications contexts reveal that the maximum lengths of alternating 1010 patterns typically seen in different applications tend to be much lower than the pattern lengths needed to impair pattern filter operation with spread spectrum. Only patterns specifically designed for such purpose would tend to be consistently problematic.

With spread spectrum the frequency tends to drift, causing the CDR to potentially lose lock. Preferable system enhancements would therefore include such provisions as employing multiple phase detectors in the channel: a first phase detector to filter out the good edges and a second phase detector to select the bad edges corrupted by DFE transitions. The multiple phase detector outputs would be weighted and summed, with the good edges being accorded greater weight. Additionally, the DFE tap(s) would be examined in value to adaptively select the phase detector to use based on the values. In such embodiments, significant hysteresis would be needed on the DFE threshold to prevent oscillations; and, selection would only be done at startup.

Figures 12A, 12B:
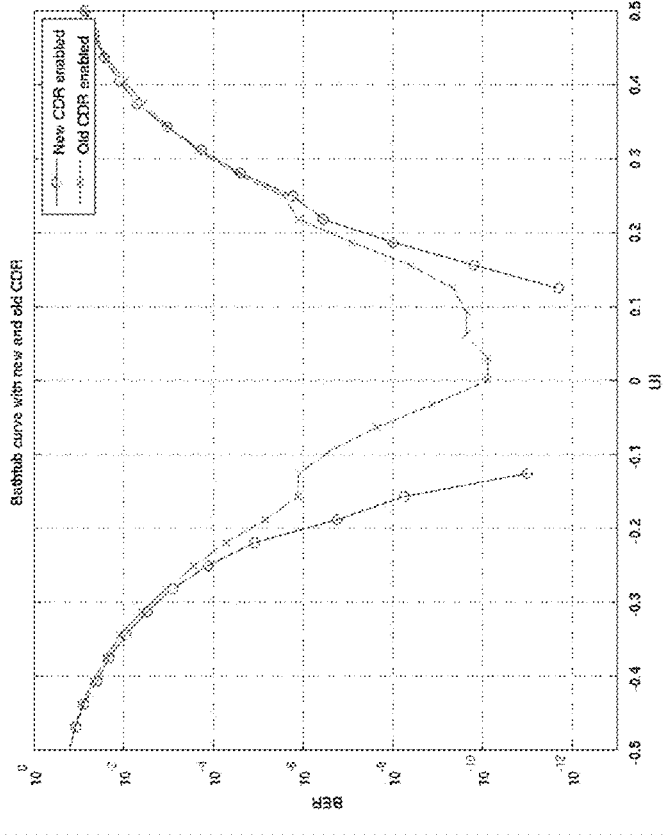
FIGS. 12A-12B are a table and graphic plot of comparative measurements for certain parameters, obtained from laboratory tests on a conventional receiver and on a receiver incorporating the exemplary phase detector embodiment illustrated in FIG. 5, each configured to use ¼ UI DFE delay; and, FIGS. 13A-13B are comparative eye plots obtained from laboratory tests on a conventional receiver and on a receiver incorporating the exemplary phase detector embodiment illustrated in FIG. 5, each configured to use ¼ UI DFE delay.

Referring to FIGS. 12A-12B, results were measured for a test setup using a 24 channel transmission medium, and no transmit de-emphasis. The given receiver was tested for jitter tolerance in comparative configurations, both with and without the new phase detector (employing "new CDR"). FIG. 12A shows the measured sinusoidal jitter tolerance, for example, to be 20% pp (peak-peak) in the new CDR case, compared to 0% in the old CDR case. Comparative measurements of the bit error rate (BER) are shown plotted for both receiver configurations as so-called bathtub curves (BER vs. UI) in FIG. 12B. These measurements were obtained with a predefined receiver compliance test pattern transmitted to both receiver configurations.

Figure 13B:
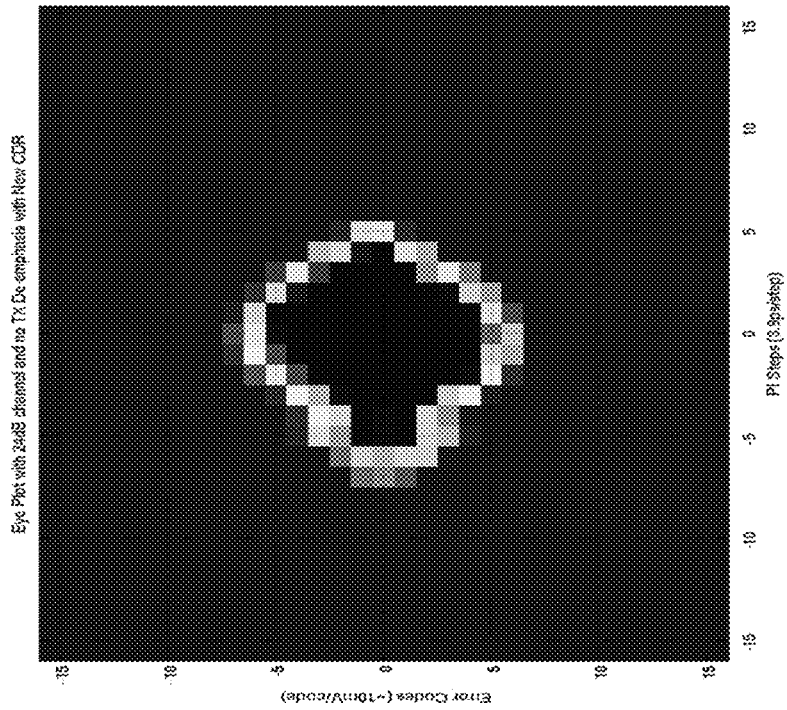
Figure 13A:
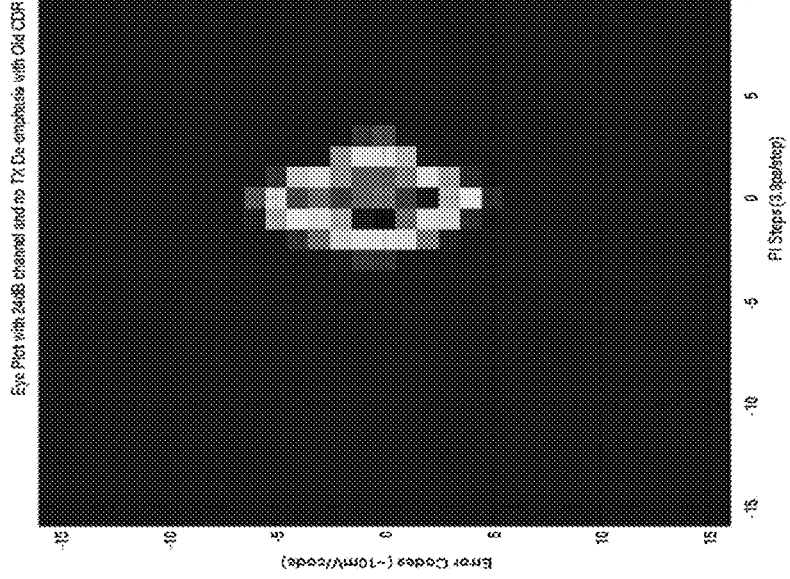

FIGS. 13A-13B comparatively show so-called eye plots (error code vs. incremental steps through one UI) of test measurements taken for both receiver configurations using an on-board eye plotter. FIG. 13A shows for the old CDR case an eye that is effectively closed, while FIG. 13B shows for the new CDR case an eye that is open, exhibiting an eye height of approximately 70 mV peak-peak and an eye width of approximately 25 ps peak-peak (@ BER=1e−12).

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for phase recovery of a signal received by a receiver having digital equalization comprising:
    a sample acquisition unit periodically acquiring over a series of predetermined unit intervals (UI) a plurality of in-phase (I) and quadrature (Q) samples of the received signal, each Q sample being disposed between consecutive I samples, said sample acquisition unit including a delay portion for selective mutual comparisons between a current I sample ID0, a first preceding I sample ID1, and a second preceding I sample ID2, wherein the ID0, ID1, ID2 samples are offset from one another by at least one UI;
    a transition detection unit coupled to said sample acquisition unit, said transition detection unit generating at least one transition detect signal responsive to the ID1 and ID0 samples and the Q sample disposed therebetween, the transition detect signal being indicative of a logic state transition in the received signal between the ID1 and ID0 samples; and,
    a transition filtering unit coupled to said sample acquisition and transition detection units, said transition filtering unit generating an equalization detect signal indicative of excessive equalizing correction of the received signal at the ID0 sample, said transition filtering unit actuating responsive to the equalization detect signal to selectively pass the transition detect signal to an output node;
    whereby corruption in the transition detect signal due to excessive equalization correction of the received signal at the ID0 sample is selectively mitigated.

2. The system as recited in claim 1, wherein said transition detection unit generates first and second transition detect signals, said transition detection unit including:
    an early transition detection portion generating the first transition detect signal responsive to comparison of the ID1 sample and the Q sample between the ID1 and ID0 samples, the first transition detect signal being indicative of early arrival at the Q sample of the logic state transition in the received signal; and
    a late transition detection portion generating the second transition detect signal responsive to comparison of the ID0 sample and the Q sample between the ID1 and ID0 samples, the second transition detect signal being indicative of late arrival at the Q sample of the logic state transition in the received signal.

3. The system as recited in claim 2, wherein each of said early and late transition detection portions includes an exclusive OR gate circuit actuated responsive to the respective I and Q samples to generate the corresponding one of the first and second transition detect signals.

4. The system as recited in claim 1, wherein said transition filtering unit includes:
    an equalization detection portion generating the equalization detect signal responsive to comparison of the ID2 and ID1 samples; and,
    a filtering portion coupled to said equalization detection portion, said filtering portion selectively passing the transition detect signal to the output node responsive to comparison with the equalization detect signal.

5. The system as recited in claim 4, wherein said filtering portion selectively passes the transition detect signal to the output node upon said transition detect and equalization detect signals collectively indicating logic state transitions in the received signal both between the ID1 and ID0 samples and between the ID2 and ID1 samples.

6. The system as recited in claim 5, wherein said equalization detection portion of said transition filtering unit includes an exclusive NOR gate circuit actuated responsive to the ID2 and ID1 samples to generate the equalization detect signal.

7. The system as recited in claim 5, wherein said filtering portion of said transition filtering unit includes at least one AND gate circuit actuated responsive to the transition detect and equalization detect signals to selectively generate an output signal matching the transition detect signal.

8. A method for phase recovery of a signal received by a receiver having digital equalization comprising:
    periodically acquiring over a series of predetermined unit intervals (UI) a plurality of in-phase (I) and quadrature (Q) samples of the received signal, each Q sample being disposed between consecutive I samples;
    selectively delaying the acquired I samples for mutual comparisons between a current I sample ID0, a first preceding I sample ID1, and a second preceding I sample ID2, wherein the ID0, ID1, ID2 samples are offset from one another by at least one UI;

establishing a transition detection unit;

executing said transition detection unit to generate at least one transition detect signal responsive to the ID1 and ID0 samples and the Q sample disposed therebetween, the transition detect signal being indicative of a logic state transition in the received signal between the ID1 and ID0 samples; and, establishing a transition filtering unit coupled to said transition detection unit;

executing said transition filtering unit to generate an equalization detect signal indicative of excessive equalizing correction of the received signal at the ID0 sample; and, executing said transition filtering unit responsive to the equalization detect signal to selectively pass the transition detect signal to an output node;

whereby corruption in the transition detect signal due to excessive equalization correction of the received signal at the ID0 sample is selectively mitigated.

9. The method as recited in claim 8, wherein said transition detection unit is executed to generate first and second transition detect signals, said transition detection unit execution including:

executing an early transition detection portion to generate the first transition detect signal responsive to comparison of the ID1 sample and the Q sample between the ID1 and ID0 samples, the first transition detect signal being indicative of early arrival at the Q sample of the logic state transition in the received signal; and executing a late transition detection portion to generate the second transition detect signal responsive to comparison of the ID0 sample and the Q sample between the ID1 and ID0 samples, the second transition detect signal being indicative of late arrival at the Q sample of the logic state transition in the received signal.

10. The method as recited in claim 9, wherein each of said early and late transition detection portions executes exclusive OR gating responsive to the respective I and Q samples to generate the corresponding one of the first and second transition detect signals.

11. The method as recited in claim 8, wherein said transition filtering unit execution includes:

executing an equalization detection portion to generate the equalization detect signal responsive to comparison of the ID2 and ID1 samples; and, executing a filtering portion coupled to selectively pass the transition detect signal to the output node responsive to comparison with the equalization detect signal.

12. The method as recited in claim 11, wherein said filtering portion is executed to selectively pass the transition detect signal to the output node upon said transition detect and equalization detect signals collectively indicating logic state transitions in the received signal both between the ID1 and ID0 samples and between the ID2 and ID1 samples.

13. The method as recited in claim 12, wherein said equalization detection portion of said transition filtering unit executes exclusive NOR gating responsive to the ID2 and ID1 samples to generate the equalization detect signal.

14. The method as recited in claim 12, wherein said filtering portion of said transition filtering unit executes at least one AND gating responsive to the transition detect and equalization detect signals to selectively generate an output signal matching the transition detect signal.

15. A system for phase detection during timing recovery for signals received by a receiver having decision feedback equalization comprising:

a sample acquisition unit periodically acquiring over a series of predetermined unit intervals (UI) a plurality of in-phase (I) and quadrature (Q) samples of the received signal, each Q sample being disposed between consecutive I samples, said sample acquisition unit including a delay portion for selective mutual comparisons of a current I sample ID0, a first preceding I sample ID1, and a second preceding I sample ID2 one I sample with respect to at least one other, wherein the ID0, ID1, ID2 samples are offset from one another by at least one UI;

a transition detection unit coupled to said sample acquisition unit, said transition detection unit generating at least first and second transition detect signals responsive to the ID1 and ID0 samples and the Q sample disposed therebetween, the first and second transition detect signals being respectively indicative of early and late arrivals of the logic state transition in the received signal at the Q sample between the ID1 and ID0 samples; and, a transition filtering unit coupled to said sample acquisition and transition detection units, said transition filtering unit acquiring a pattern of logic state transitions between respective pairs of the ID2, ID1, and ID0 samples to generate responsive thereto an equalization detect signal indicative of excessive equalizing correction of the received signal at the ID0 sample, said transition filtering unit actuating responsive to the equalization detect signal to selectively set a timing output signal to one of the first and second transition detect signals;

whereby corruption in the transition detect signal due to excessive equalization correction of the received signal at the ID0 sample is selectively mitigated.

16. The system as recited in claim 15, wherein said transition detection unit includes:

an early transition detection portion generating the first transition detect signal responsive to comparison of the ID1 sample and the Q sample between the ID1 and ID0 samples; and a late transition detection portion generating the second transition detect signal responsive to comparison of the ID0 sample and the Q sample between the ID1 and ID0 samples.

17. The system as recited in claim 16, wherein said transition filtering unit includes:

an equalization detection portion generating the equalization detect signal responsive to comparison of the ID2 and ID1 samples; and, a filtering portion coupled to said equalization detection portion, said filtering portion comparing each of the first and second transition detect signals with the equalization detect signal to selectively set the timing output signal responsive thereto.

18. The system as recited in claim 17, wherein said filtering portion selectively passes the transition detect signal to the output node upon said transition detect and equalization detect signals collectively indicating logic state transitions in the received signal both between the ID1 and ID0 samples and between the ID2 and ID1 samples.

19. The system as recited in claim 18, wherein each of said early and late transition detection portions includes an exclusive OR gate circuit actuated responsive to the respective I and Q samples to generate the corresponding one of the first and second transition detect signals.

20. The system as recited in claim 19, wherein:

said equalization detection portion of said transition filtering unit includes an exclusive NOR gate circuit actuated responsive to the ID2 and ID1 samples to generate the equalization detect signal; and, said filtering portion of said transition filtering unit includes:
a first AND gate circuit actuated responsive to the first transition detect and equalization detect signals; and,
a second AND gate circuit actuated responsive to the second transition detect and equalization detect signals.

* * * * *